(12) United States Patent
Miyasaka et al.

(10) Patent No.: US 7,989,810 B2
(45) Date of Patent: Aug. 2, 2011

(54) SEMICONDUCTOR DEVICE, ELECTROOPTICAL APPARATUS, AND ELECTRONIC SYSTEM

(75) Inventors: Mitsutoshi Miyasaka, Suwa (JP); Atsushi Miyazaki, Suwa (JP)

(73) Assignee: Seiko Epson Corporation (JP)

( * ) Notice: Subject to any disclaimer, the term of this patent is extended or adjusted under 35 U.S.C. 154(b) by 170 days.

(21) Appl. No.: 12/369,240

(22) Filed: Feb. 11, 2009

(65) Prior Publication Data

US 2009/0242890 A1   Oct. 1, 2009

(30) Foreign Application Priority Data

Mar. 27, 2008 (JP) .................................. 2008-084791

(51) Int. Cl.
*H01L 29/786* (2006.01)
(52) U.S. Cl. .......................................... 257/66; 257/40
(58) Field of Classification Search ................. 257/202, 257/223, 227, 290, 331, 334, 390, 59, 347–354, 257/524; 438/58, 99; 349/43, 45, 46, 73; 359/57, 59, 67
See application file for complete search history.

(56) References Cited

U.S. PATENT DOCUMENTS

| | | | | |
|---|---|---|---|---|
| 6,917,394 | B2 * | 7/2005 | Song et al. ...................... | 349/43 |
| 7,289,171 | B2 * | 10/2007 | Kim et al. ...................... | 349/43 |
| 7,453,538 | B2 * | 11/2008 | Nam et al. ..................... | 349/139 |
| 2001/0015256 | A1 * | 8/2001 | Yamazaki et al. ............. | 156/289 |
| 2006/0023138 | A1 * | 2/2006 | Choi et al. ...................... | 349/46 |
| 2007/0254456 | A1 * | 11/2007 | Maruyama et al. ........... | 438/458 |
| 2008/0237582 | A1 * | 10/2008 | Cho et al. ....................... | 257/40 |

FOREIGN PATENT DOCUMENTS

| | | |
|---|---|---|
| JP | 2004-109975 | 4/2004 |
| JP | 2006-245091 | 9/2006 |

* cited by examiner

*Primary Examiner* — Marcos D Pizarro
*Assistant Examiner* — Sue Tang
(74) *Attorney, Agent, or Firm* — Harness, Dickey & Pierce, P.L.C.

(57) ABSTRACT

A semiconductor device on a flexible substrate includes a semiconductor layer constituting a plurality of bottom-gate thin-film transistors, first wiring lines, second wiring lines, a first insulating layer, and a gate insulating film. The first insulating layer and the gate insulating film are present below the semiconductor layer, the first wiring lines, and the second wiring lines and are partially removed in regions where the semiconductor layer, the first wiring lines, and the second wiring lines are not disposed.

6 Claims, 30 Drawing Sheets

SEMICONDUCTOR DEVICE, ELECTROOPTICAL APPARATUS, AND ELECTRONIC SYSTEM

BACKGROUND

1. Technical Field

The present invention relates to semiconductor devices, and particularly to semiconductor devices on flexible substrates.

2. Related Art

In the development of electrooptical apparatuses such as liquid crystal apparatuses, the use of flexible substrates has recently been studied to reduce the size and weight of the apparatuses and to make them flexible and resistant to impact. JP-A-2004-109975, for example, discloses a technique for producing a flexible thin-film transistor (TFT) display using a metal foil substrate. In addition, JP-A-2006-245091 discloses a method for producing an electrooptical apparatus by a transfer process and a technique based on the application of this method to flexible displays.

The inventors have been engaged in research and development of electrooptical apparatuses using flexible substrates such as resin layers to improve the characteristics of the apparatuses.

An active-matrix substrate (array substrate) for use in the above electrooptical apparatuses, for example, has an array of pixels including TFTs and pixel electrodes. The TFTs and the pixel electrodes are provided by forming an inorganic insulating film, such as a silicon oxide film or a silicon nitride film, over the entire surface of a glass substrate as a base insulating film and then forming various other films thereon.

If TFTs and pixel electrodes are provided on a base insulating film formed over the entire surface of a flexible substrate, however, a mechanical or thermal stress may cause a crack in the base insulating film and the TFTs formed thereon because of the difference in flexibility between the flexible substrate and the base insulating film, thus degrading the characteristics of the apparatus.

SUMMARY

An advantage of some aspects of the invention is that it provides a reliable semiconductor device on a flexible substrate such as a resin layer.

A semiconductor device on a flexible substrate according to a first aspect of the invention includes a semiconductor layer constituting a plurality of bottom-gate thin-film transistors, first wiring lines, second wiring lines, a first insulating layer, and a gate insulating film. The first insulating layer and the gate insulating film are present below the semiconductor layer, the first wiring lines, and the second wiring lines and are partially removed in regions where the semiconductor layer, the first wiring lines, and the second wiring lines are not disposed.

According to the first aspect, the first insulating layer and the gate insulating film are not disposed over the entire surface of the substrate, but are disposed below the semiconductor layer, the first wiring lines, and the second wiring lines and are partially removed in the regions where they are not disposed. Accordingly, a mechanical or thermal stress applied to the semiconductor device is reduced, so that the components such as the first insulating layer are less likely to crack. This improves the characteristics (reliability) of the thin-film transistors disposed thereabove.

A semiconductor device on a flexible substrate according to a second aspect of the invention includes first and second wiring layers constituting a part of wiring, a first insulating layer on which the first wiring layer is disposed, and a gate insulating film on which the second wiring layer is disposed. The gate insulating film is disposed between the first and second wiring layers. The second wiring layer does not intersect other wiring and is connected to the first wiring layer with the gate insulating film partially removed.

According to the second aspect, a part of the wiring is divided into the first and second wiring layers (multilayer structure), so that the first insulating layer can be separately disposed below the first wiring layer. The first insulating layer is therefore less likely to crack when a mechanical or thermal stress is applied to the semiconductor device. This improves the reliability of the semiconductor device.

In the above semiconductor device, the first wiring layer may include a group of first wiring layer segments, the second wiring layer may include a group of second wiring layer segments, the first insulating layer may include first insulating layer segments arranged in an island-like pattern on the flexible substrate, the first wiring layer segments may be arranged in an island-like pattern, and the island-like first wiring layer segments may be disposed on the island-like first insulating layer segments. The group of first wiring layer segments refers to a plurality of first wiring layer segments; the same applies to the group of second wiring layer segments and a group of semiconductor layer segments.

In this case, because the first insulating layer includes the island-like first insulating layer segments on which the first wiring layer segments are disposed, the first insulating layer is less likely to crack when a mechanical or thermal stress is applied to the semiconductor device. This improves the reliability of the semiconductor device.

The gate insulating film may include gate insulating film segments arranged in an island-like pattern and be disposed between the groups of first and second wiring layer segments, the second wiring layer segments may be arranged in an island-like pattern, and the island-like second wiring layer segments may be disposed on the island-like gate insulating film segments. If the gate insulating film includes the island-like gate insulating film segments, a stress applied to the semiconductor device can be further reduced.

The first and second wiring layer segments may be connected together in regions where the first and second wiring layer segments do not intersect other wiring. If the wiring has a multilayer structure (in which the first and second wiring layer segments are connected together) in the regions where the first and second wiring layer segments do not intersect other wiring, the first insulating layer can be divided into finer segments.

A semiconductor device on a flexible substrate according to a third aspect of the invention includes a group of semiconductor layer segments constituting a plurality of bottom-gate thin-film transistors, groups of first and second wiring layer segments constituting a part of wiring, a first insulating layer, and a gate insulating film. The first insulating layer includes first insulating layer segments arranged in an island-like pattern on the flexible substrate, and the semiconductor layer segments and the first wiring layer segments are disposed above the island-like first insulating layer segments.

According to the third aspect, the first insulating layer is not disposed over the entire surface of the substrate, but is divided so as to be disposed below the individual semiconductor layer segments and the individual first wiring layer segments, so that the first insulating layer is less likely to crack. This improves the characteristics of the thin-film transistors disposed thereabove.

The gate insulating film may include gate insulating film segments arranged in an island-like pattern and be disposed between the groups of first and second wiring layer segments. In addition, the second wiring layer segments may be disposed on the island-like gate insulating film segments. If the gate insulating film includes the island-like gate insulating film segments, a stress applied to the thin-film transistors can be further reduced.

The first and second wiring layer segments may be connected together in regions where the first and second wiring layer segments do not intersect other wiring. If the wiring has a multilayer structure (in which the first and second wiring layer segments are connected together) in the regions where the first and second wiring layer segments do not intersect other wiring, the first insulating layer can be divided into finer segments.

For example, the first insulating layer and the gate insulating film may be formed of different materials. For example, the first insulating layer may be formed of a silicon oxide film, and the gate insulating film may be formed of a silicon nitride film.

An electrooptical apparatus may include the above semiconductor devices. This improves the characteristics of the electrooptical apparatus.

An electronic system may include the above semiconductor devices or the electrooptical apparatus. This improves the characteristics of the electronic system.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
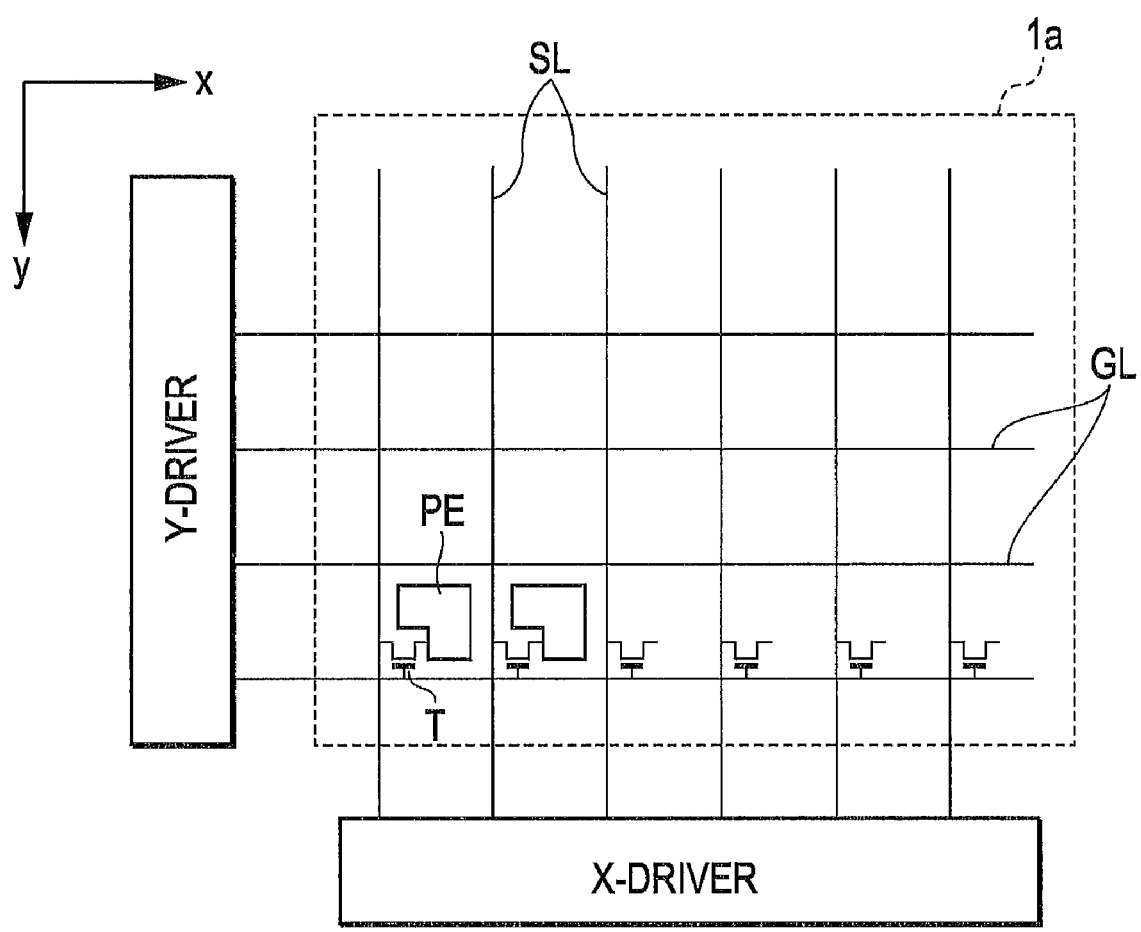
FIG. 1 is a circuit diagram showing the structure of an array substrate according to a first embodiment.

Embodiments of the invention will now be described in detail with reference to the drawings, where the components with the same functions are indicated by the same or related reference numerals to avoid repeated description. The embodiments will be described by taking as an example a method for producing a semiconductor device on a flexible substrate by directly forming the semiconductor device on a flexible substrate such as a plastic substrate or a thin metal substrate, although the invention can also be applied to a method for producing a semiconductor device on a flexible substrate by a transfer process.

First Embodiment

Structure of Array Substrate

FIG. 1 is a circuit diagram showing the structure of an array substrate according to this embodiment. In FIG. 1, the array substrate includes gate lines (wiring lines) GL extending in the x direction and constituting a part of wiring for a semiconductor device in a display section (display region) 1a and source lines (wiring lines) SL extending in the y direction and constituting a part of the wiring for the semiconductor device. Pixels are arranged in a matrix at intersections of the source lines SL and the gate lines GL. These pixels include pixel electrodes PE and TFTs T. For example, the source lines SL are driven by an X-driver, whereas the gate lines GL are driven by a Y-driver.

The array substrate according to this embodiment, as described in detail below, at least includes a semiconductor layer constituting bottom-gate TFTs, first wiring lines (first gate lines GL1 and second gate lines GL2), second wiring lines (source lines SL), a first insulating layer (base insulating film), and a gate insulating film, and the first insulating layer and the gate insulating film are present below the semiconductor layer, the first wiring lines, and the second wiring lines and are partially removed in regions where they are not disposed (see FIG. 9).

In a second embodiment to be described later, the gate lines GL, which constitute a part of the wiring, are composed of first wiring layer segments (first gate lines GL1) and second wiring layer segments (second gate lines GL2) that are arranged alternately on different insulating layers. The insulating layers at least include a first insulating layer functioning as a base insulating film and a gate insulating film. The first wiring layer is disposed on the first insulating layer, whereas the second wiring layer is disposed on the gate insulating film. The gate insulating film is disposed between the first and second wiring layers to electrically insulate the two wiring layers from each other. The first and second wiring layer segments are connected together alternately in regions where they do not intersect other wiring. In this case, the second wiring layer segments (second gate lines GL2) are connected to the first wiring layer segments (first gate lines GL1) with the gate insulating film partially removed. In the second embodiment, additionally, the source lines SL, which constitute a part of the wiring, are also composed of first wiring layer segments (first source lines SL1) and second wiring layer segments (second source lines SL2) that are arranged alternately on different insulating layers. The insulating layers at least include the first insulating layer and the gate insulating film. The first wiring layer is disposed on the first insulating layer, whereas the second wiring layer is disposed on the gate insulating film. The gate insulating film is disposed between the first and second wiring layers to electrically insulate the two wiring layers from each other. The first and second wiring layer segments are connected together alternately in regions where they do not intersect other wiring (for example, the gate lines GL). In this case, the second wiring layer segments (second source lines SL2) are connected to the first wiring layer segments (first source lines SL1) with the gate insulating film partially removed.

Figure 23:
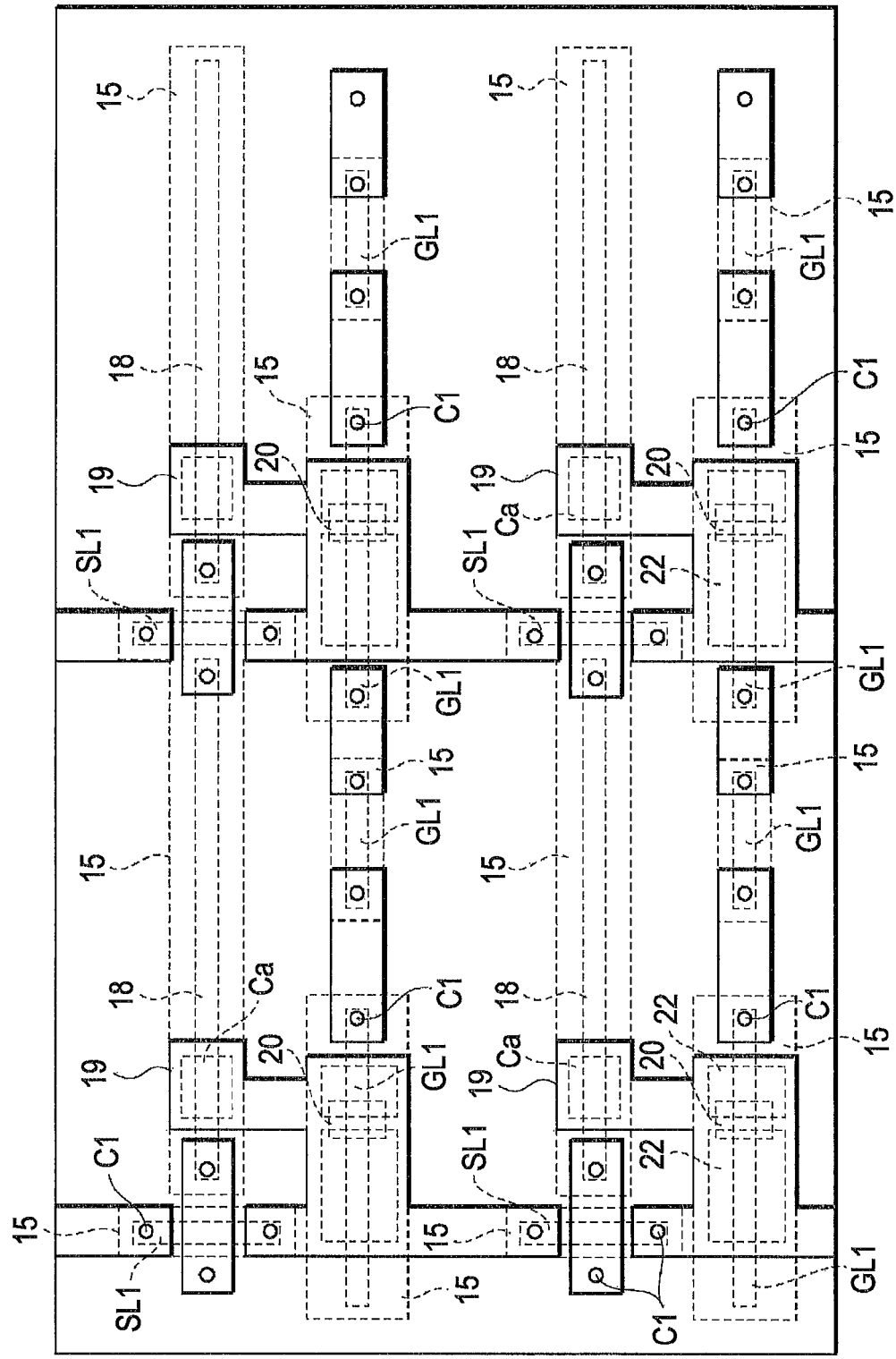
FIG. 23 is a plan view illustrating the method for producing the array substrate according to the second embodiment.

The base insulating film, serving as the first insulating layer, includes base insulating film segments arranged in an island-like pattern. The first wiring layer segments, such as the first source lines SL1 and the first gate lines GL1, are also arranged in an island-like pattern, and the island-like first wiring layer segments are disposed on the island-like base insulating film segments. That is, the base insulating film is divided into islands arranged only below the island-like first wiring layer segments and capacitor electrodes (18) and is partially removed in the other region. In addition, the gate insulating film includes gate insulating film segments arranged in an island-like pattern. The second wiring layer segments, such as the second source lines SL2 and the second gate lines GL2, are also arranged in an island-like pattern, and the island-like second wiring layer segments are disposed on the island-like gate insulating film segments. That is, the gate insulating film is divided into islands arranged only below the island-like second wiring layer segments and island-like semiconductor films and is partially removed in the other region (see FIG. 23).

The base insulating film has four functions: (1) improving adhesion of a semiconductor film and a metal film to a flexible substrate; (2) preventing impurities from diffusing from a flexible substrate such as a plastic substrate or a metal substrate into a semiconductor film during the production of TFTs; (3) ensuring insulation from a metal substrate (electrical separation between elements and wiring lines); and (4) reducing the capacitance of a metal or semiconductor substrate (parasitic capacitance between wiring and the substrate). Forming a thicker base insulating film enhances the effectiveness of the second function (preventing impurity diffusion) and the fourth function (reducing substrate capacitance) and the reliability of the first function (improving adhesion) and the third function (ensuring insulation). Thus, in general, thicker base insulating films are desirable for thin-film electronic devices. The interlayer insulating film (gate insulating film), on the other hand, functions to insulate wiring lines (for example, the gate lines GL) from other wiring lines (for example, the source lines SL) and to minimize parasitic capacitance between the different wiring lines. To ensure the insulation and minimize the parasitic capacitance, thicker interlayer insulating films are desirable for electronic devices. Thus, a thicker base insulating film and a thicker interlayer insulating film are desirable. A flexible electronic device based on a flexible substrate, however, tends to crack and break if it includes a thick base insulating film and a thick interlayer insulating film. To sum up, a thinner base insulating film and a thinner interlayer insulating film are desirable for flexible electronic devices in terms of reliability. To resolve this problem, according to the invention, the base insulating film and the interlayer insulating film are provided only in necessary regions and, in the second embodiment, these insulating films are divided into islands. In addition, long wiring lines (such as gate lines and source lines used in, for example, liquid crystal displays and electrophoretic displays), even though they can theoretically be formed of single wiring lines, are constituted of groups of first and second wiring layer segments arranged on different insulating layers. The first wiring layer segments are disposed on the island-like first insulating layer segments, whereas the second wiring layer segments are disposed on the island-like interlayer insulating film segments. This eliminates long or large islands of insulating films, and they are divided into many, relatively small islands. As a result, a mechanical or thermal stress applied to the flexible electronic device is dispersed between the island-like insulating film segments, so that the base insulating film and the interlayer insulating film, formed of brittle inorganic materials (such as silicon oxide or silicon nitride), are less likely to crack. The electronic device is therefore less likely to crack due to an external stress, thus having significantly improved device reliability and life. In addition, the thickness of the island-like insulating film segments can be sufficiently increased, for example, from 200 nm to 700 nm. As a result, even if low-temperature polysilicon TFTs (LTPS-TFTs), which are produced at temperatures ranging from 200° C. to 600° C., are used, impurities can reliably be prevented from diffusing from the substrate into a semiconductor film during the production of the LTPS-TFTs, so that they can be formed with superior electronic characteristics. In addition, good adhesion of a semiconductor film and metal wiring lines can be achieved, and insulation between elements can be maintained. If the flexible substrate is formed of a metal, its capacitance can be sufficiently reduced because the thick base insulating film is disposed below the semiconductor film and the metal wiring lines. This allows a semiconductor circuit that operates at high speed to be formed on the flexible substrate. In addition, a short-circuit defect between different wiring lines, such as the gate lines and the source lines, can be prevented, and parasitic capacitance between the wiring lines can be reduced, so that a superior semiconductor device that operates at high speed without malfunction can be provided. The flexible substrate is formed of a material such as plastic, metal, fiber, or paper.

Process of Producing Array Substrate

Figure 7:
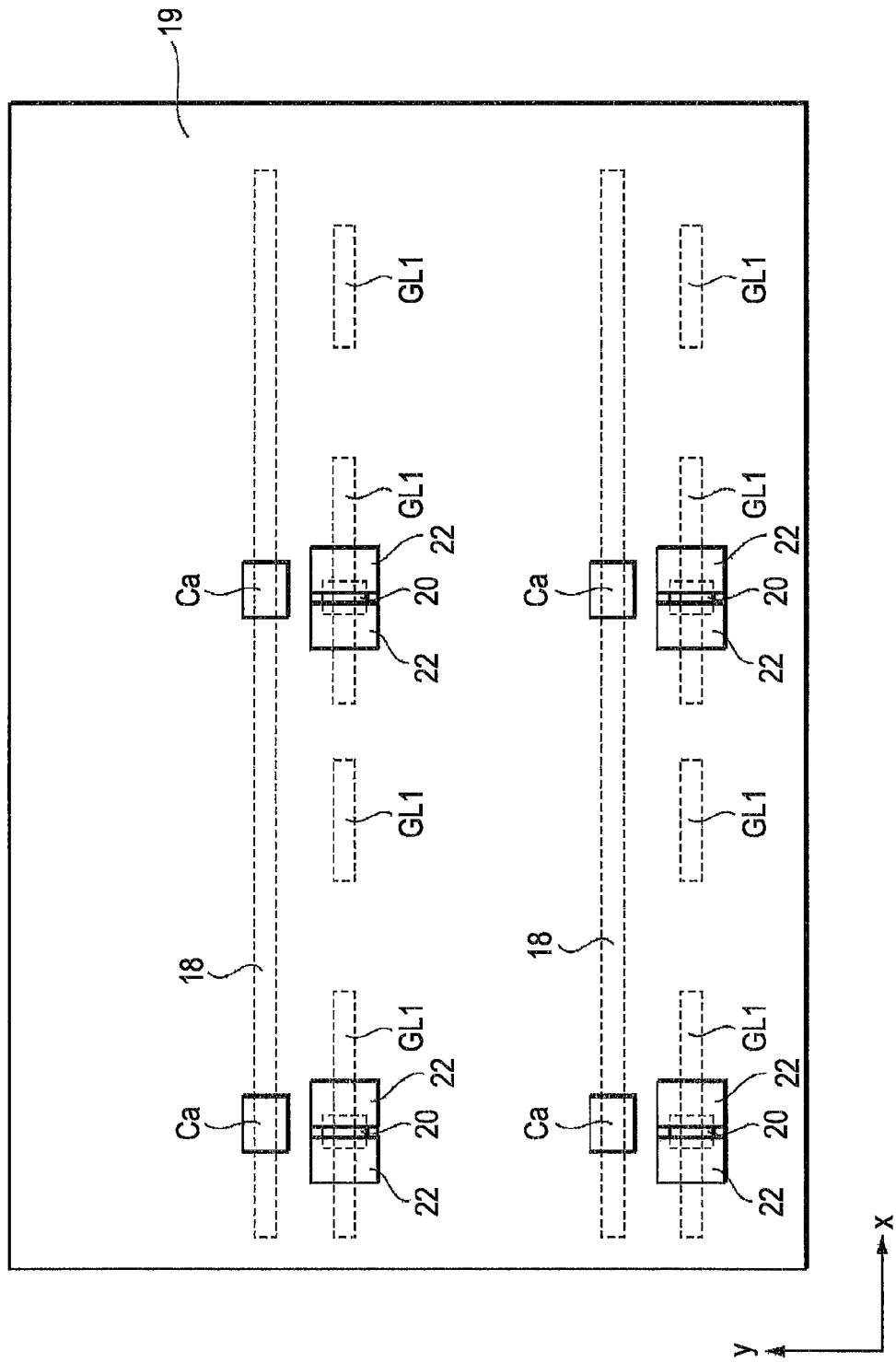
FIG. 7 is a plan view illustrating the method for producing the array substrate according to the first embodiment.
Figure 8:
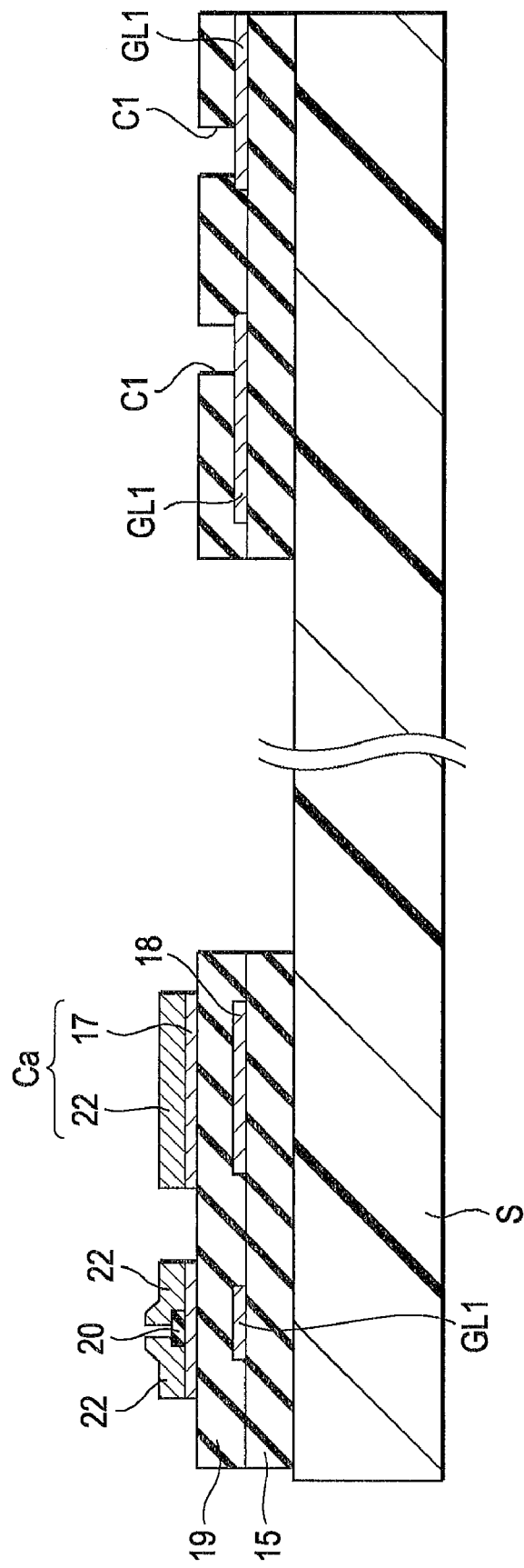
FIG. 8 is a sectional view illustrating the method for producing the array substrate according to the first embodiment.
Figure 9:
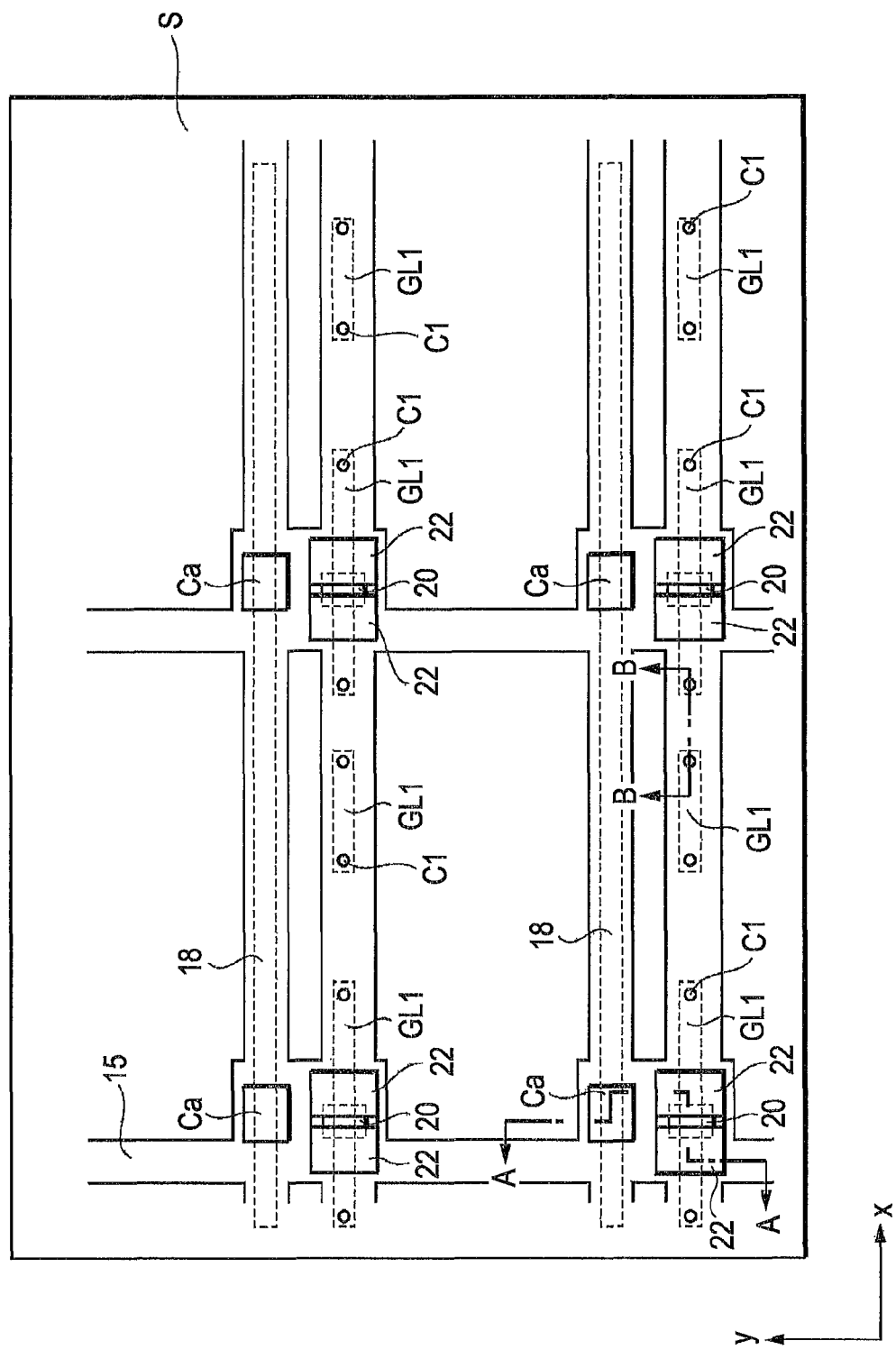
FIG. 9 is a plan view illustrating the method for producing the array substrate according to the first embodiment.

FIGS. 2 to 13 are sectional views and plan views illustrating a method for producing the array substrate according to this embodiment, where the sectional views are taken along, for example, lines A-A and B-B of FIG. 9. Referring to these drawings, the method for producing the array substrate according to this embodiment will be described, and its structure will be clarified.

Figure 2:
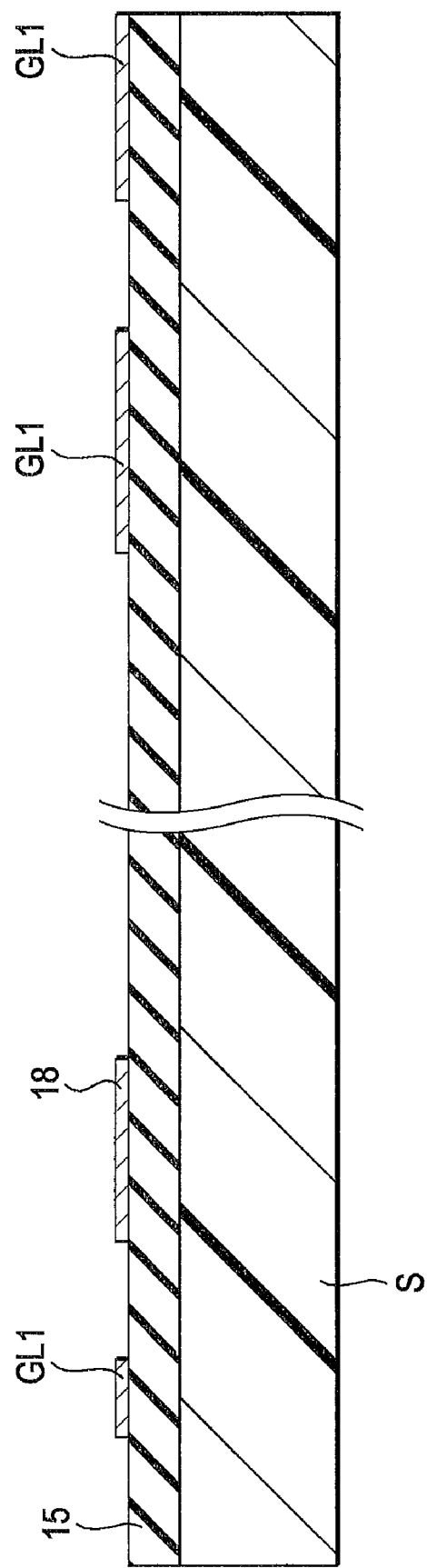
FIG. 2 is a sectional view illustrating a method for producing the array substrate according to the first embodiment.

Referring to FIG. 2, a base insulating film 15 is formed over the entire surface of a flexible substrate S (herein called a resin layer for convenience of description, although the material used is not limited to resin and may also be, for example, metal, fiber, or paper) by depositing, for example, a silicon oxide film to a thickness of about 300 to 500 nm by chemical vapor deposition (CVD). If a resin film is formed on a glass substrate and is removed therefrom after TFTs are formed on the film, the film corresponds to the substrate S. The silicon oxide film may be replaced with another inorganic insulating film such as a silicon nitride film.

Figure 3:
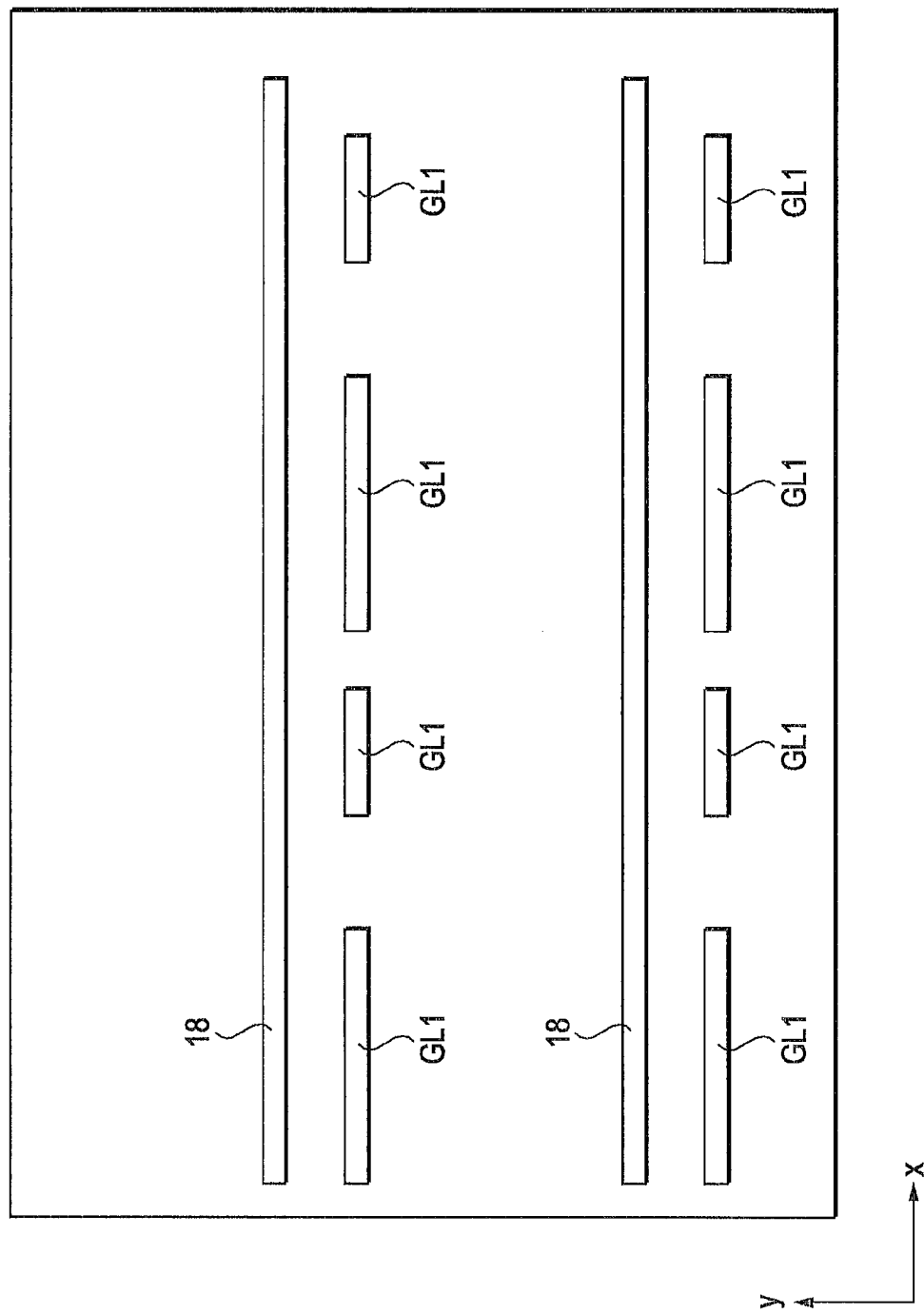
FIG. 3 is a plan view illustrating the method for producing the array substrate according to the first embodiment.

First gate lines (gate electrodes) GL1 and first electrodes 18 of hold capacitors are formed on the base insulating film 15 by depositing a conductive film, for example, a metal film such as an aluminum film, by sputtering and patterning the film. Referring to FIG. 3, the first electrodes 18 are formed in lines extending in the x direction and are shared by the pixels arranged in the x direction. The first gate lines GL1 are divided into a predetermined pattern and are arranged at intervals in the x direction. It is advantageous in terms of ease of design to form the first gate lines GL1 and the first electrodes 18 such that their pitch agrees with the pixel pitch or an integral multiple thereof.

Figure 4:
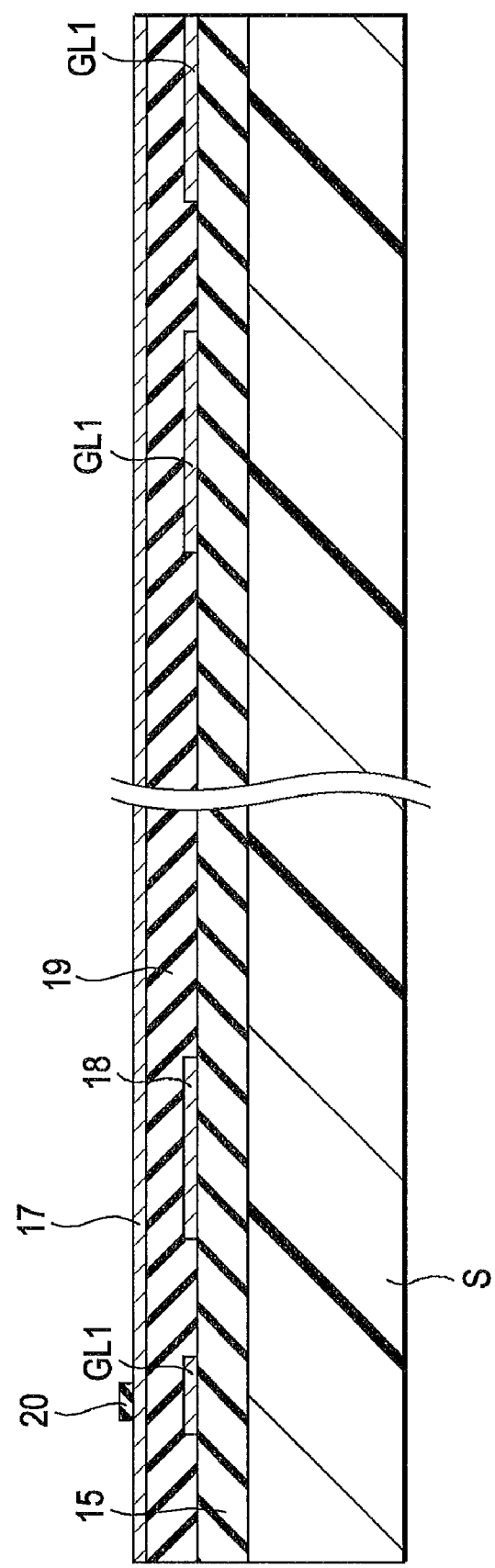
FIG. 4 is a sectional view illustrating the method for producing the array substrate according to the first embodiment.
Figure 5:
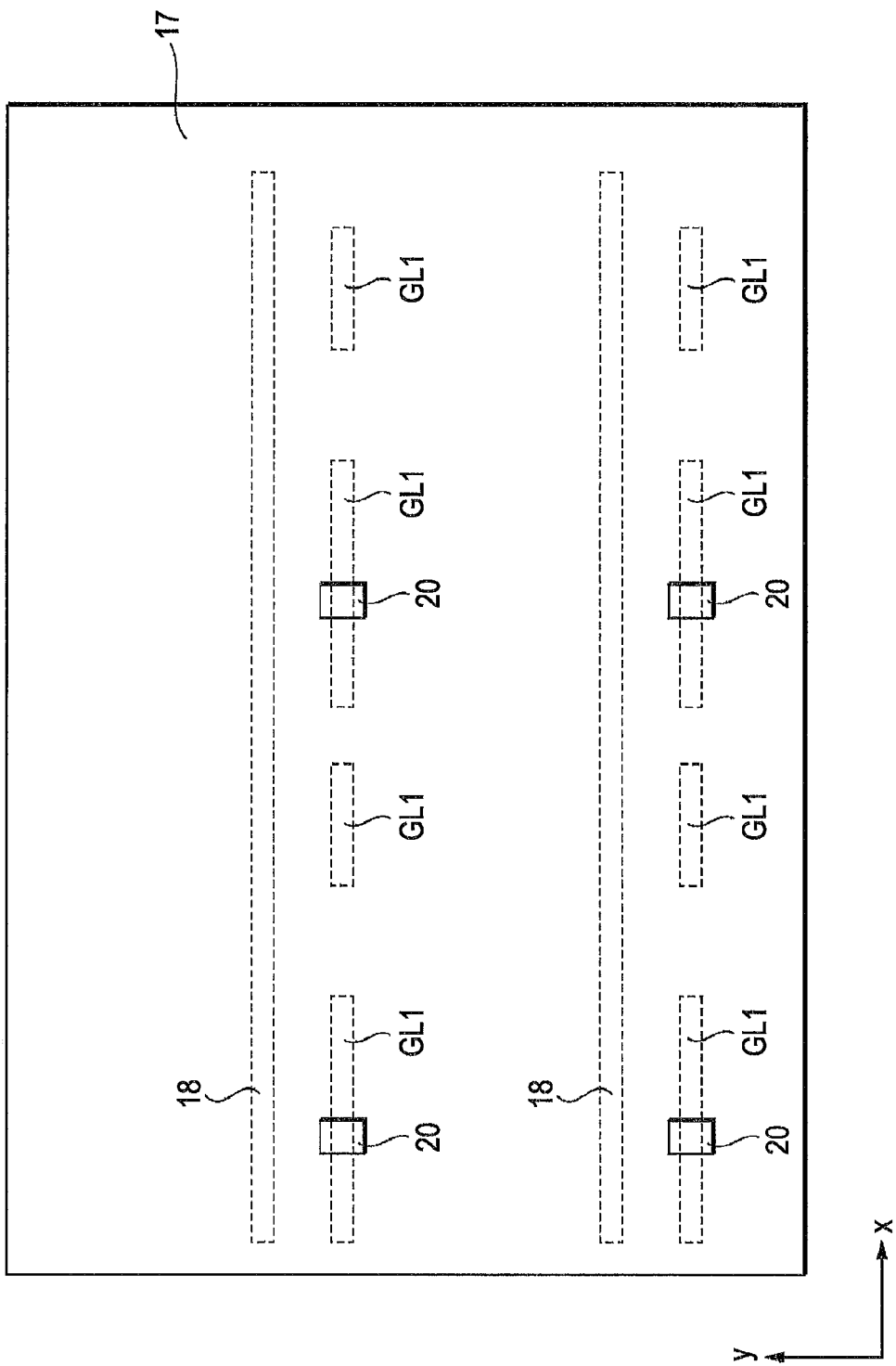
FIG. 5 is a plan view illustrating the method for producing the array substrate according to the first embodiment.

Referring to FIG. 4, a gate insulating film 19 is formed over the entire surface of the substrate S by depositing, for example, a silicon nitride film to a thickness of about 75 nm by CVD. The gate insulating film 19 may thus be formed of a material different from that of the base insulating film 15.

A semiconductor film 17 is formed over the entire surface of the gate insulating film 19 by depositing, for example, an undoped amorphous silicon film by CVD. Substantially rectangular etching stopper films (insulating films) 20 are then formed on channel regions (above the first gate lines GL1) of the semiconductor film 17 (see FIG. 5).

Figure 6:
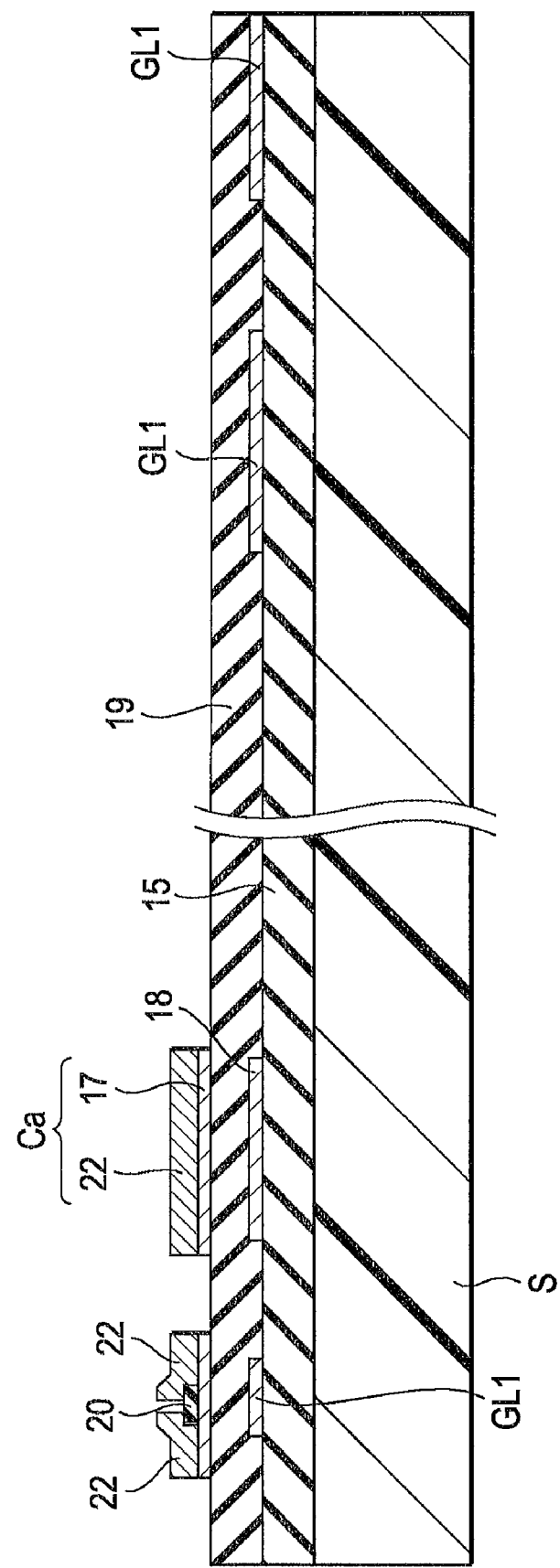
FIG. 6 is a sectional view illustrating the method for producing the array substrate according to the first embodiment.

Referring to FIG. 6, an impurity-doped semiconductor film 22 is deposited on the semiconductor film 17 and the etching stopper films 20 by CVD. The laminate of the semiconductor film 17 and the impurity-doped semiconductor film 22 is etched into substantially rectangular shapes. The impurity-doped semiconductor films 22 are further etched above the channel regions to expose the etching stopper films 20. Referring to FIG. 7, as a result, the etching stopper films 20 remain in substantially the centers of the substantially rectangular semiconductor films 17. In addition, the impurity-doped semiconductor films 22 remain on both sides of the etching stopper films 20, serving as source and drain electrodes. The semiconductor films 17 and the impurity-doped semiconductor films 22 also remain above the first electrodes 18 as substantially rectangular laminates Ca. These laminates Ca serve as second electrodes of the hold capacitors.

The step of forming the etching stopper films 20 can be omitted if the patterning (etching) of the semiconductor film 17 and the impurity-doped semiconductor film 22 can be controlled so as to form the above pattern.

Referring to FIG. 8, the gate insulating film 19 and the base insulating film 15 are patterned. As shown in FIG. 9, the gate insulating film 19 and the base insulating film 15 are patterned such that they remain below the semiconductor films 17 constituting the individual pixels, the first gate lines GL1, and the regions, described later, where second gate lines GL2 are to be formed, remain below the first electrodes 18, and remain below the regions, described later, where the source lines SL are to be formed. At the same time, contact holes C1 are formed by etching the gate insulating film 19 above both ends of the first gate lines GL1.

Figure 10:
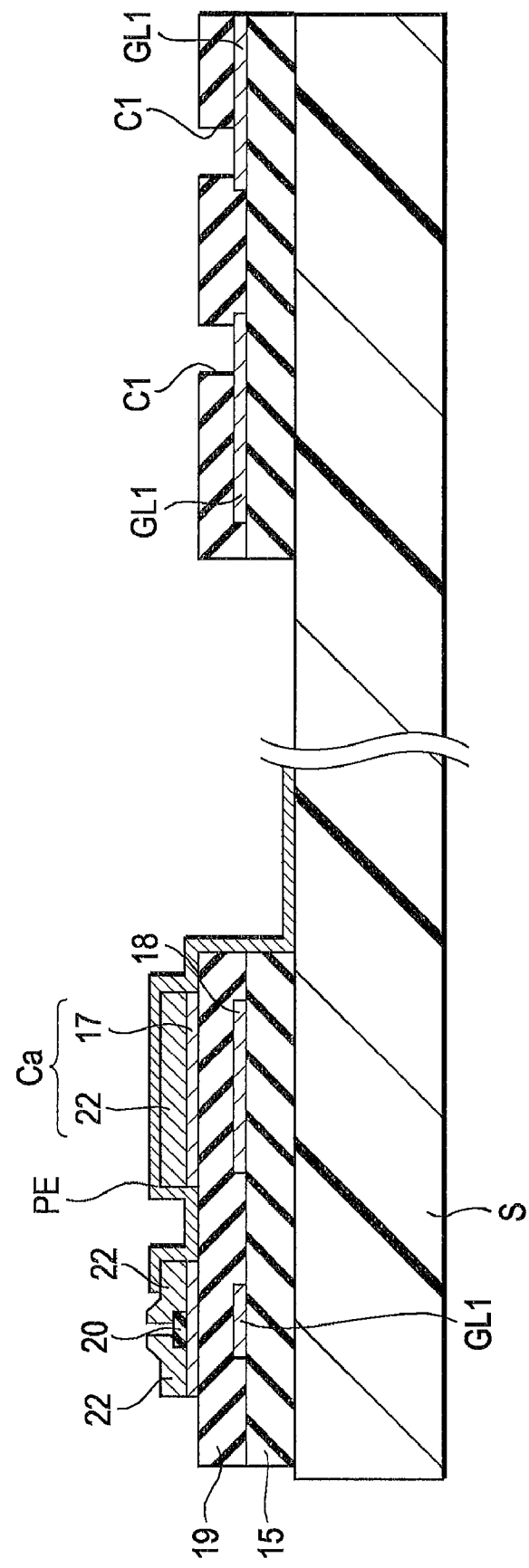
FIG. 10 is a sectional view illustrating the method for producing the array substrate according to the first embodiment.
Figure 11:
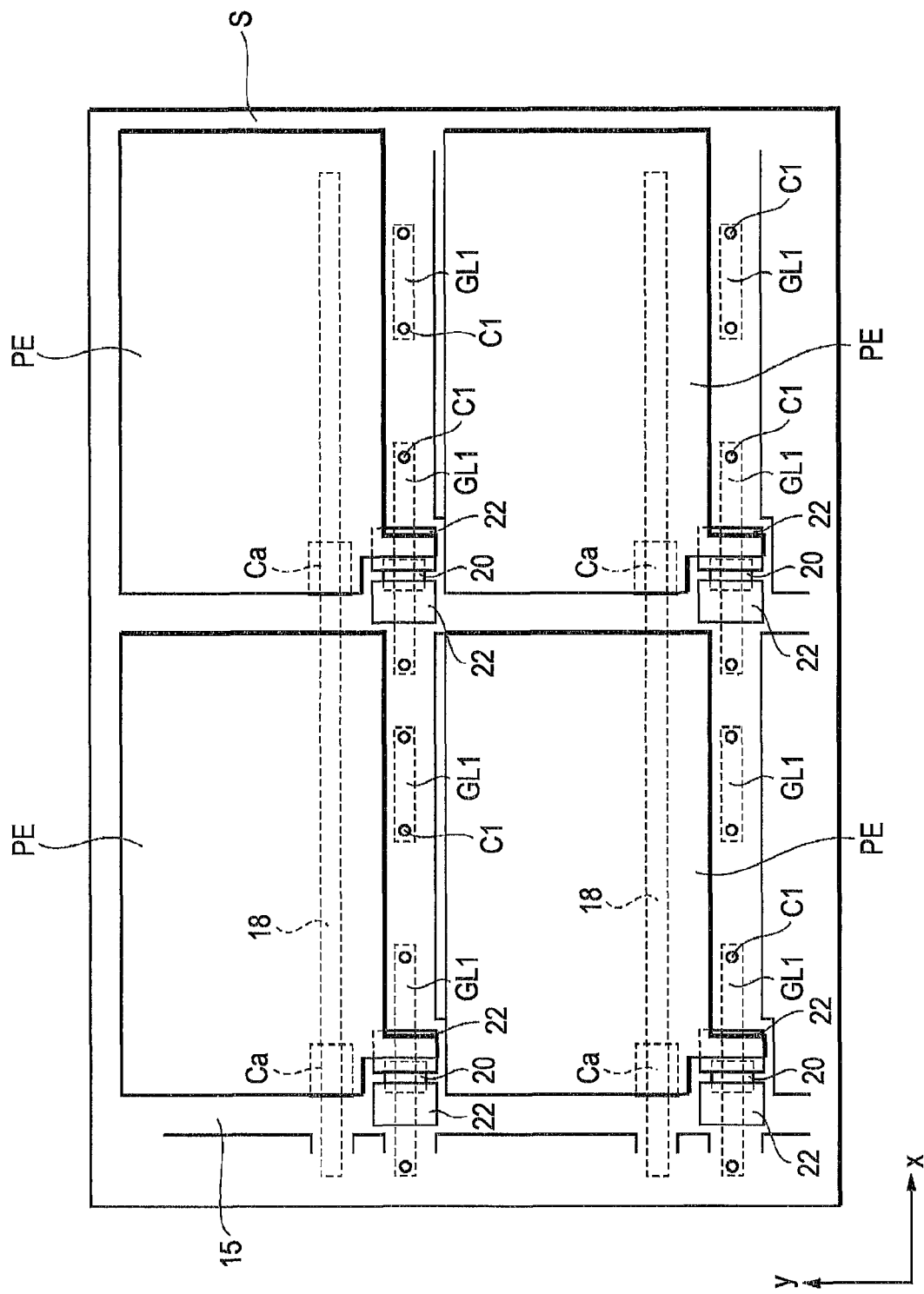
FIG. 11 is a plan view illustrating the method for producing the array substrate according to the first embodiment.

Referring to FIGS. 10 and 11, the pixel electrodes PE are formed by depositing a conductive film, such as an indium tin oxide (ITO) film, on the substrate S by sputtering and patterning the film.

Figure 12:
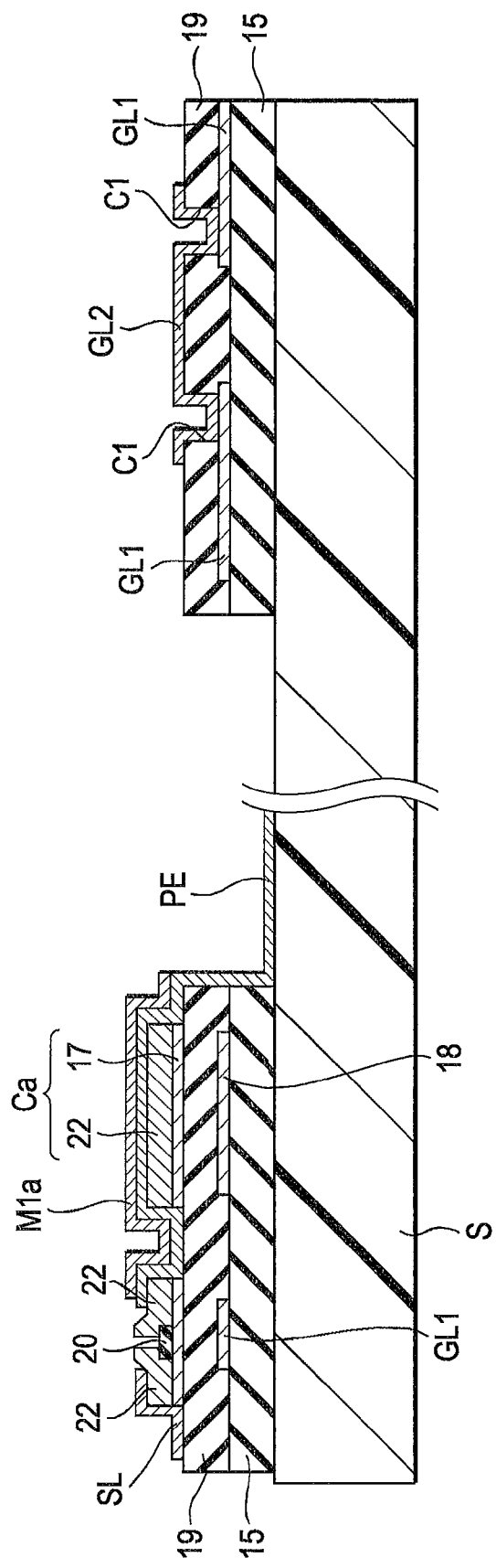
FIG. 12 is a sectional view illustrating the method for producing the array substrate according to the first embodiment.
Figure 13:
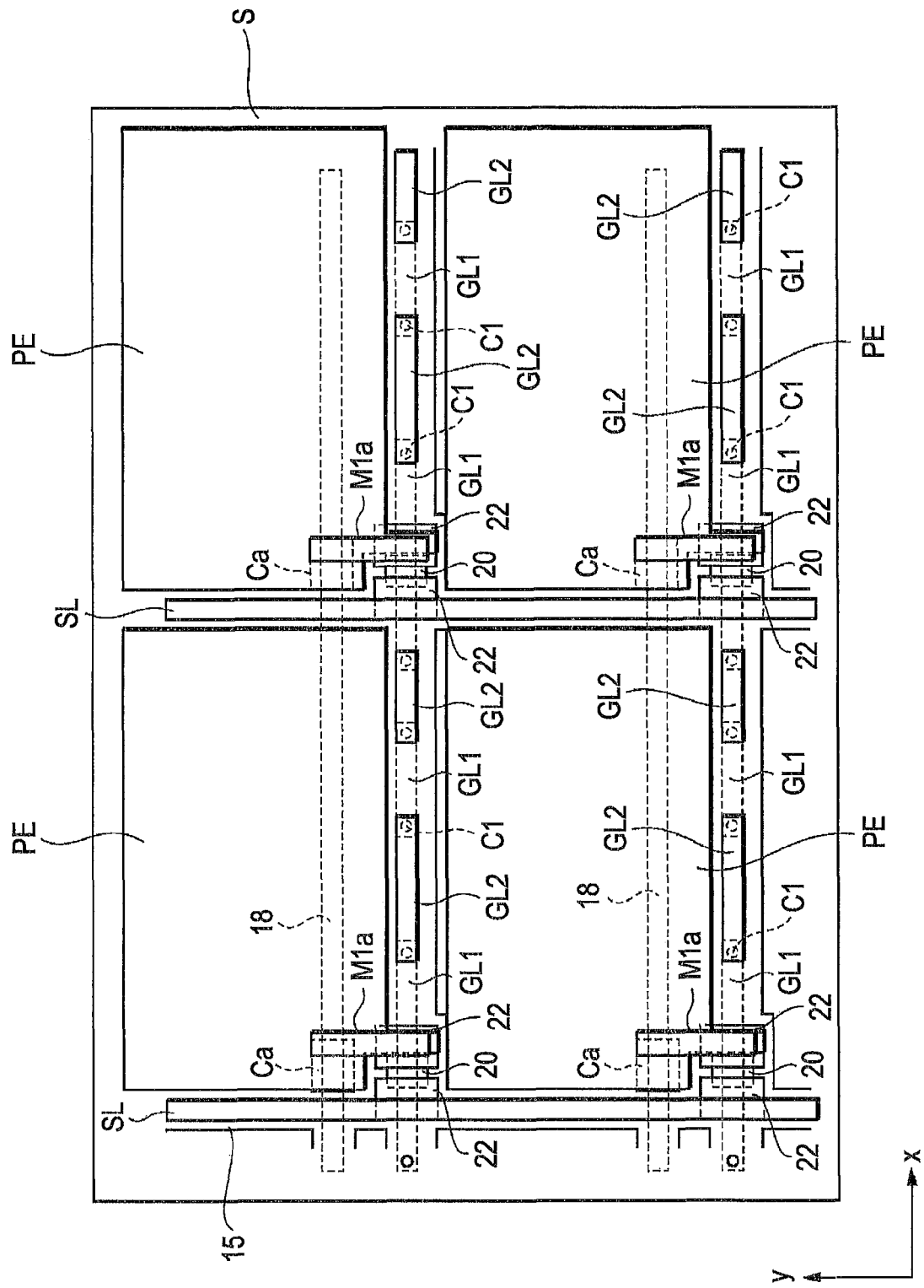
FIG. 13 is a plan view illustrating the method for producing the array substrate according to the first embodiment.

Referring to FIGS. 12 and 13, first-layer wiring lines M1a, the source lines SL, and the second gate lines GL2 are formed by depositing a conductive film, such as an aluminum film, on the substrate S by sputtering and patterning the film. The first-layer wiring lines M1a extend above the impurity-doped semiconductor films 22 (source and drain electrodes) in the y direction. The source lines SL extend above the impurity-doped semiconductor films 22 (source and drain electrodes) in the y direction. The second gate lines GL2 extend above the regions between the first gate lines GL1 in the x direction. The source lines SL and the second gate lines GL2 may instead be formed by ink jetting. For example, the conductive films can be formed by ejecting a liquid material containing conductive particles into a desired pattern by ink jetting before drying and baking (solidifying) the ejected material; in this case, the patterning (etching) step can be omitted. The other conductive films may also be formed by ink jetting.

After the above process, the bottom-gate TFTs and the pixel electrodes PE are formed on the substrate S (array substrate).

Process of Producing Electrophoretic Display

Subsequently, an electrophoretic display (not shown) is produced by bonding an electrophoretic sheet including a counter electrode and an electrophoretic capsule layer to a surface of the substrate S in which the pixel electrodes PE are exposed.

In this embodiment, as described in detail above, the base insulating film 15 is partially formed on the substrate S below the semiconductor films 17 constituting the individual pixels, the gate lines GL (GL1 and GL2) extending in the x direction, the first electrodes 18, and the source lines SL (see FIG. 9).

The base insulating film 15 can therefore prevent diffusion of contaminants into the components such as the semiconductor films 17 and the gate lines GL. In addition, the base insulating film 15 can improve the adhesion of the components such as the semiconductor films 17 and the gate lines GL. Furthermore, if the substrate S is formed of a conductive material, the base insulating film 15 can insulate the components such as the semiconductor films 17 and the gate lines GL from the substrate S.

In addition, because the base insulating film 15 is partially formed, a stress applied to the base insulating film 15 is reduced as compared with the case where the base insulating film 15 is formed over the entire surface of the substrate S, so that the base insulating film 15 is less likely to crack.

Accordingly, the TFTs and their constituent films are less likely to be damaged or cracked, and therefore an increased yield and improved transistor characteristics (reliability) can be achieved.

Although the gate lines GL have a multilayer structure including the first gate lines GL1 and the second gate lines GL2 in this embodiment, the gate lines GL may be formed by forming the first gate lines GL1 in lines extending in the x direction.

Second Embodiment

Although the gate lines GL have a multilayer structure in the first embodiment, both the gate lines GL and the source lines SL may have a multilayer structure. The components with the same functions as those in the first embodiment are indicated by the same reference numerals to avoid repeated description.

Structure of Array Substrate

In an array substrate according to this embodiment, as described in detail below, the source lines SL are composed of first source lines SL1 and second source lines SL2 arranged alternately in different wiring layers, the gate lines GL are composed of first gate lines GL1 and second gate lines GL2 arranged alternately in different wiring layers, and the base insulating film 15 is divided and arranged below the first source lines SL1 and the first gate lines GL1. The regions where the base insulating film 15 is formed may be changed as needed; for example, it may be formed below semiconductor films forming TFTs and also below hold capacitors if they are formed. The circuit configuration of the array substrate and the functions of the base insulating film 15 in this embodiment are as described in the first embodiment.

Process of Producing Array Substrate

Figure 20:
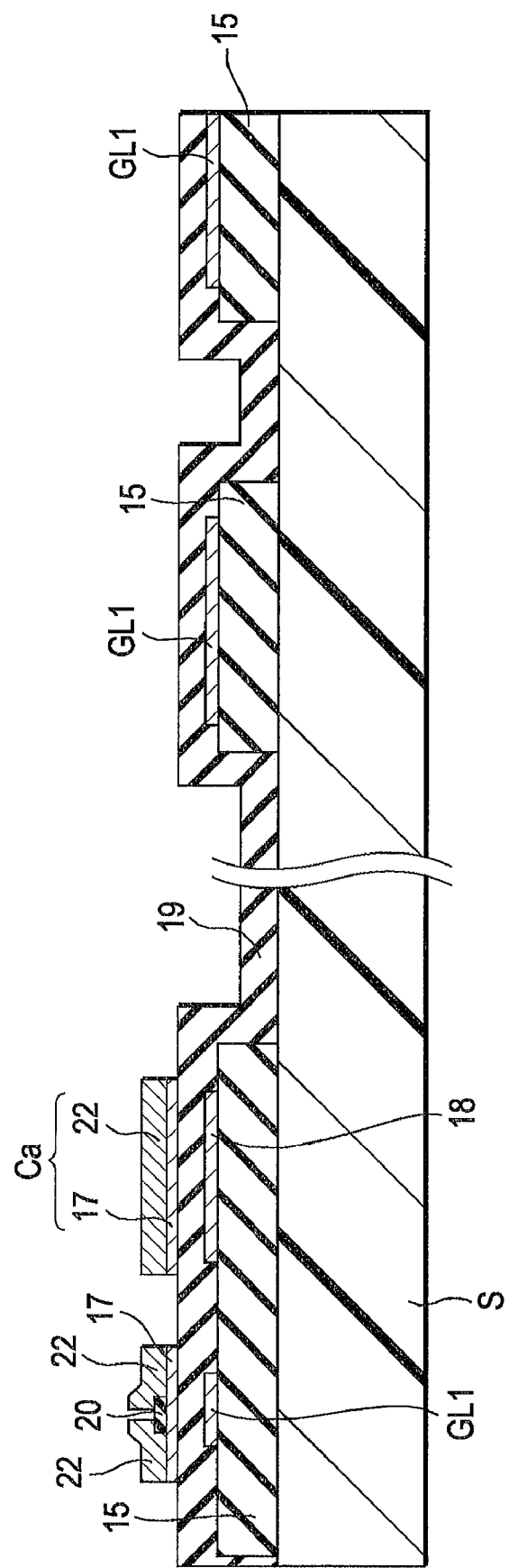
FIG. 20 is a sectional view illustrating the method for producing the array substrate according to the second embodiment.
Figure 21:
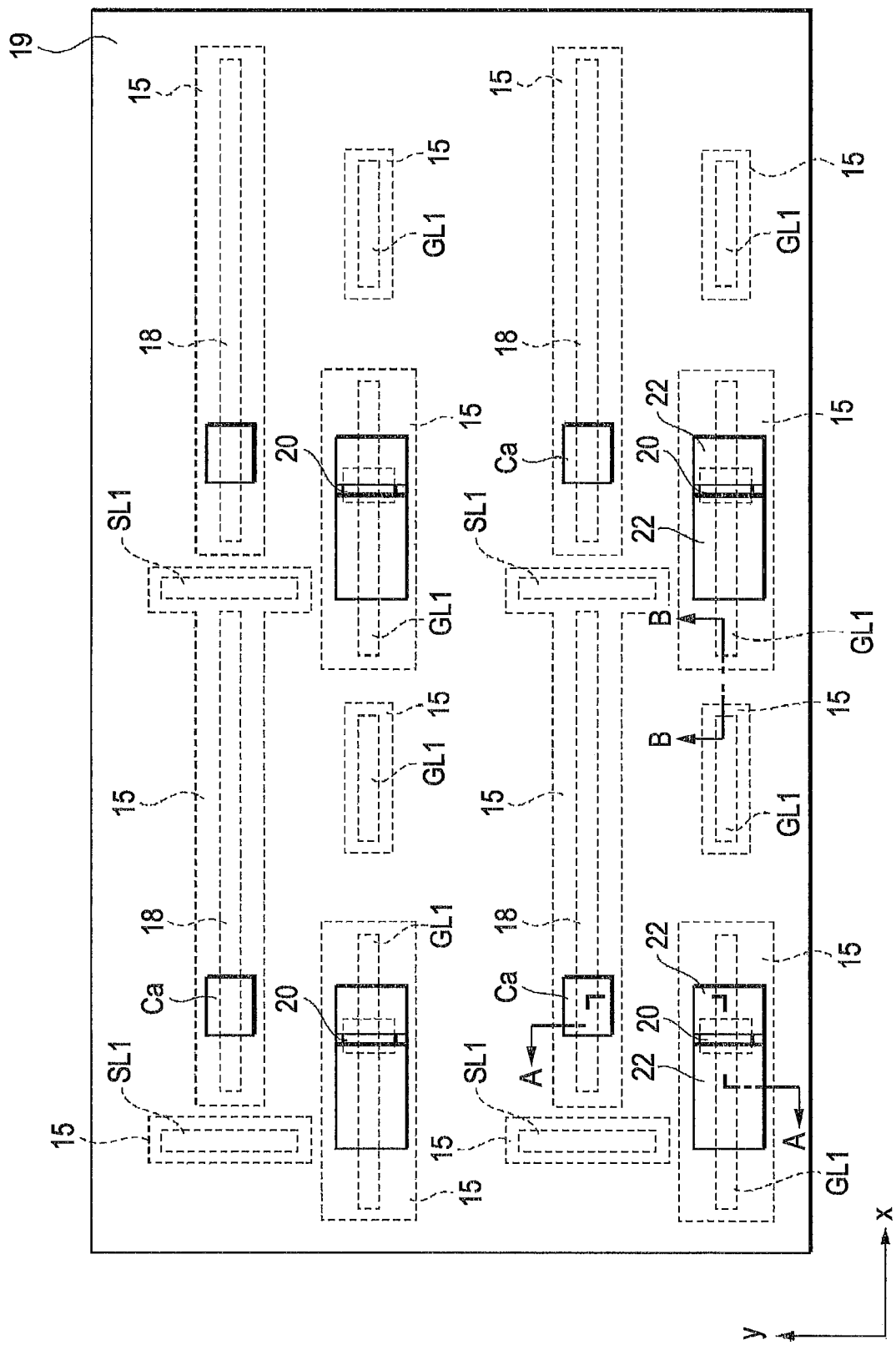
FIG. 21 is a plan view illustrating the method for producing the array substrate according to the second embodiment.

FIGS. 14 to 28 are sectional views and plan views illustrating a method for producing the array substrate according to this embodiment, where the sectional views are taken along, for example, lines A-A and B-B of FIG. 21. Referring to these drawings, the method for producing the array substrate according to this embodiment will be described, and its structure will be clarified.

Figure 14:
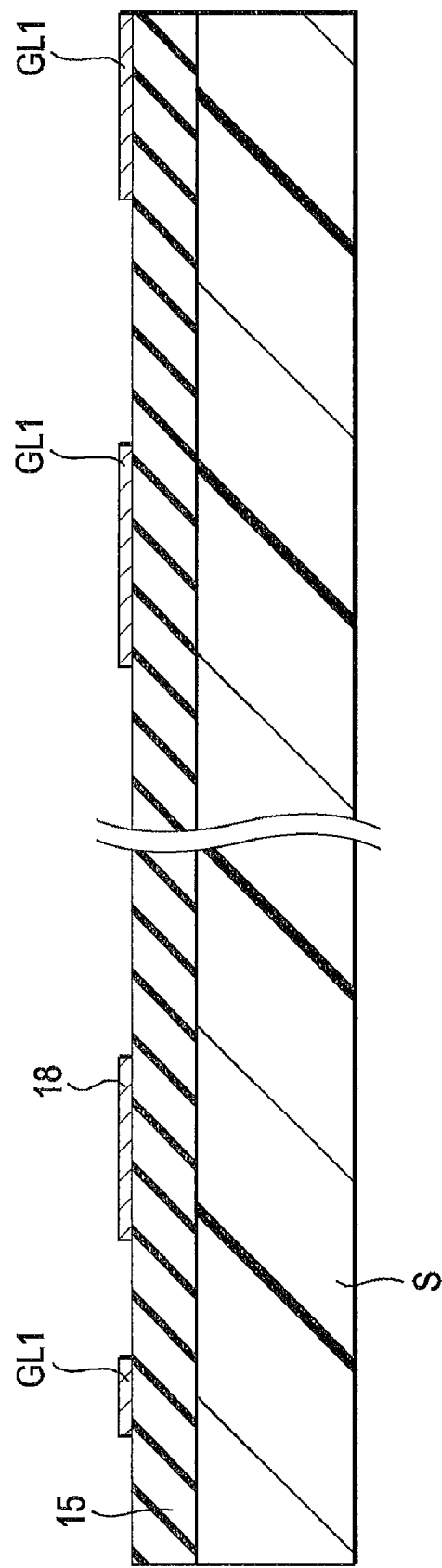
FIG. 14 is a sectional view illustrating a method for producing an array substrate according to a second embodiment.

Referring to FIG. 14, the base insulating film 15 is formed over the entire surface of the flexible substrate (resin layer) S by depositing, for example, a silicon oxide film to a thickness of about 300 to 500 nm by CVD. The silicon oxide film may be replaced with another inorganic insulating film such as a silicon nitride film.

Figure 15:
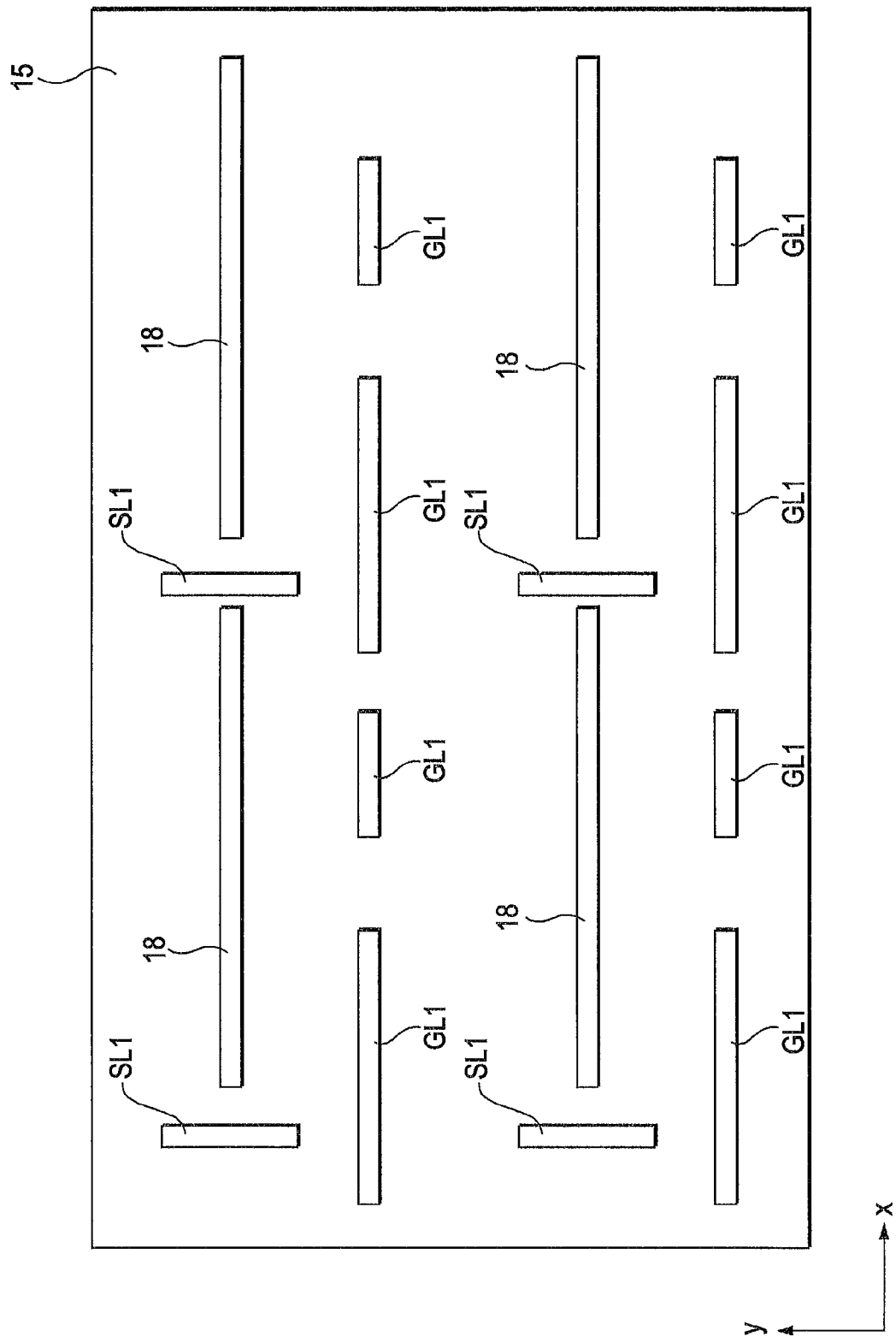
FIG. 15 is a plan view illustrating the method for producing the array substrate according to the second embodiment.

The first gate lines (gate electrodes) GL1, the first source lines SL1, and the first electrodes 18 of the hold capacitors are formed on the base insulating film 15 by depositing a conductive film, for example, a metal film such as an aluminum film, by sputtering and patterning the film. Referring to FIG. 15, the first electrodes 18 are formed in lines extending in the x direction and correspond to the individual pixels. The first gate lines GL1 are divided into a predetermined pattern and are arranged at intervals in the x direction, whereas the first source lines SL1 are divided into a predetermined pattern and are arranged at intervals in the y direction.

Figure 16:
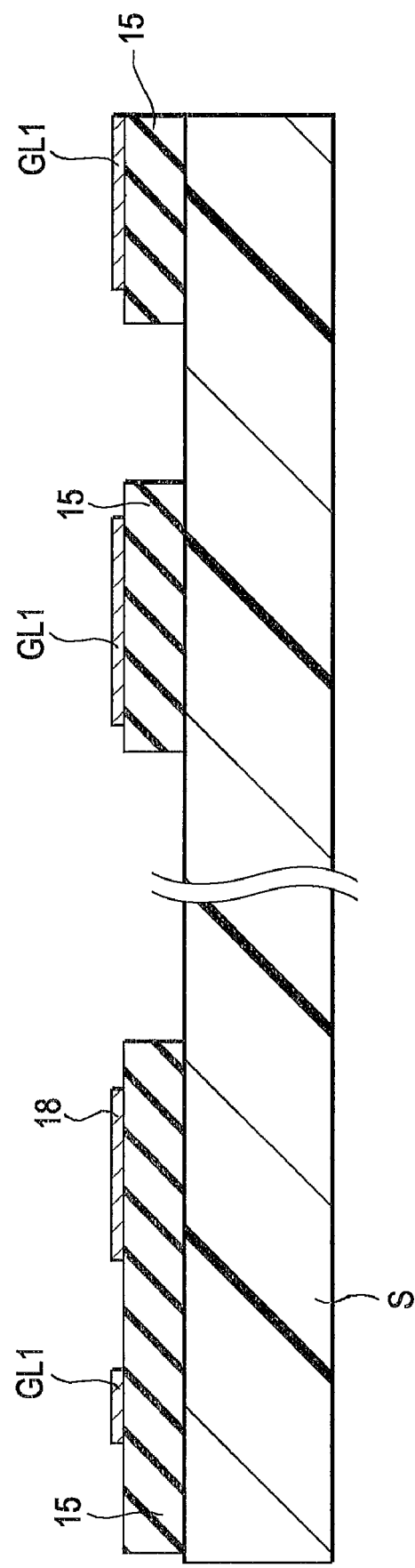
FIG. 16 is a sectional view illustrating the method for producing the array substrate according to the second embodiment.
Figure 17:
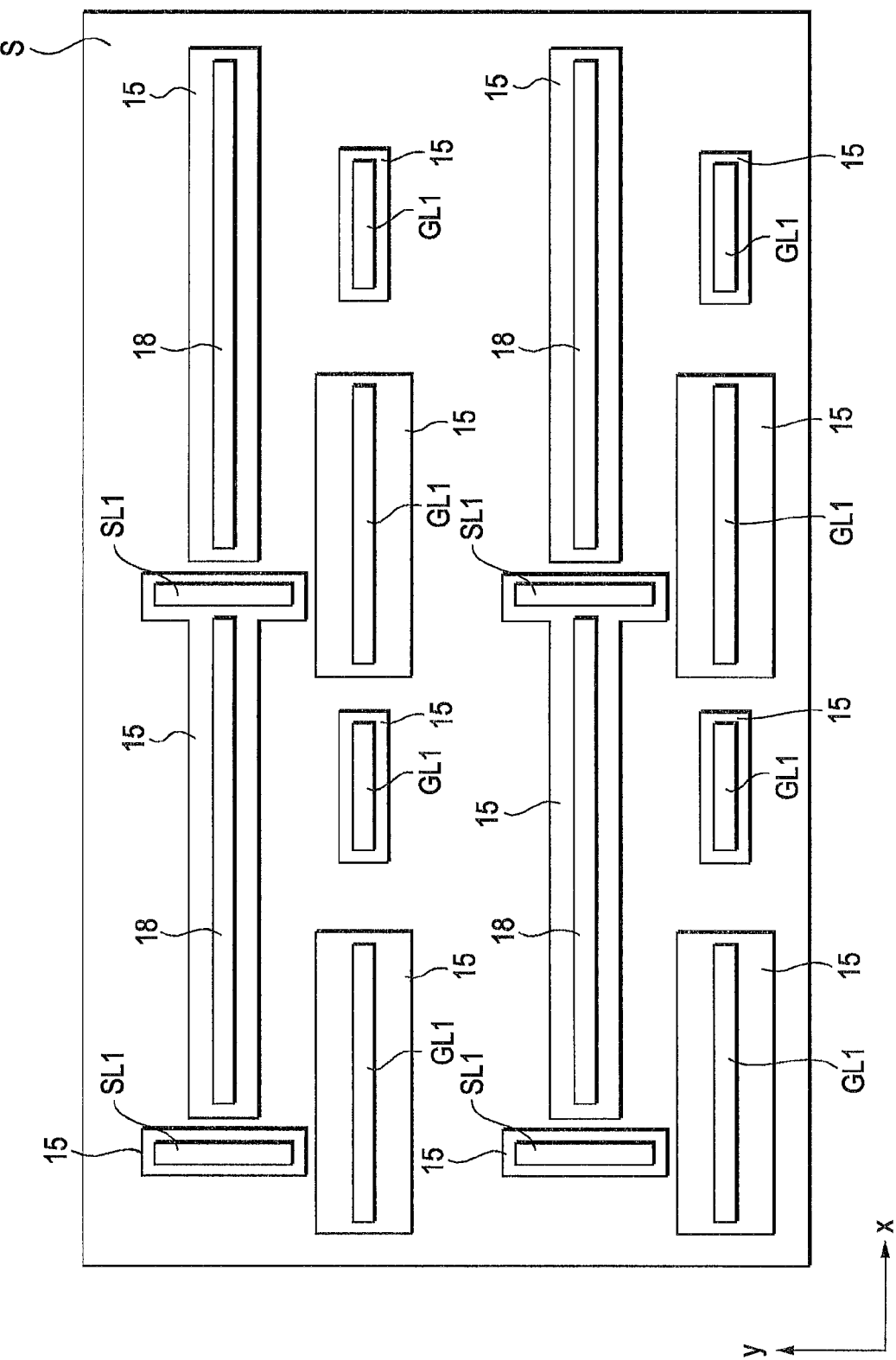
FIG. 17 is a plan view illustrating the method for producing the array substrate according to the second embodiment.

Referring to FIG. 16, the base insulating film 15 is patterned such that it remains only below the first gate lines GL1, the first source lines SL1, and the first electrodes 18 (see FIG. 17). That is, the pattern of the base insulating film 15 covers regions including the pattern of the first gate lines GL1, the first source lines SL1, and the first electrodes 18 and margins of certain width d (see FIG. 17). The certain width d refers to a distance of six to twelve times the sum of the standard deviation $\sigma A$ due to alignment and the standard deviation $\sigma E$ due to etching variations from the edges of the semiconductor films and the first wiring layer segments ($6(\sigma A+\sigma E)<d<12(\sigma A+\sigma E)$). A flexible electronic device including smaller islands of patterned base insulating film is more reliable, although if the islands are extremely small, islands of semiconductor film and first wiring layer would extend off the islands of base insulating film. The probability of a deviation of more than six times the standard deviation is $2\times10^{-9}$. Hence, even for a semiconductor device including millions of transistors and a total of nearly ten million islands of semiconductor film and first wiring layer, the expected number of islands of semiconductor film and first wiring layer that extend off the islands of base insulating film does not exceed 0.1. Typically, the standard deviation $\sigma A$ due to alignment is about 0.1 μm, and the standard deviation $\sigma E$ due to etching is about 0.2 μm; therefore, the width d may be about 1.8 to 3.6 μm. If the islands of semiconductor film and first wiring layer are not simply rectangular but are bent, the islands of base insulating film may be formed in simple shapes (such as rectangles) with the distance from the outermost edges being d. In FIG. 17, for example, although the islands of the base insulating film 15 below the first source lines SL1 and the first electrodes 18 of the hold capacitors are T-shaped, they may instead be simply rectangular. In this case, the length of the rectangular islands of the base insulating film 15 in the y direction is determined based on a distance of six to twelve times the sum of the standard deviation $\sigma A$ due to misalignment and the standard deviation $\sigma E$ due to etching variations from the outermost edges of the first source lines SL1 and the first electrodes 18 in the y direction. The length of the rectangular islands of the base insulating film 15 in the x direction, on the other hand, is determined based on a distance of six to twelve times the sum of the standard deviation $\sigma A$ due to alignment and the standard deviation $\sigma E$ due to etching variations from the outermost edges of the first source lines SL1 and the first electrodes 18 in the x direction. The pattern of the base insulating film 15 may also be similarly determined in the first embodiment.

Figure 18:
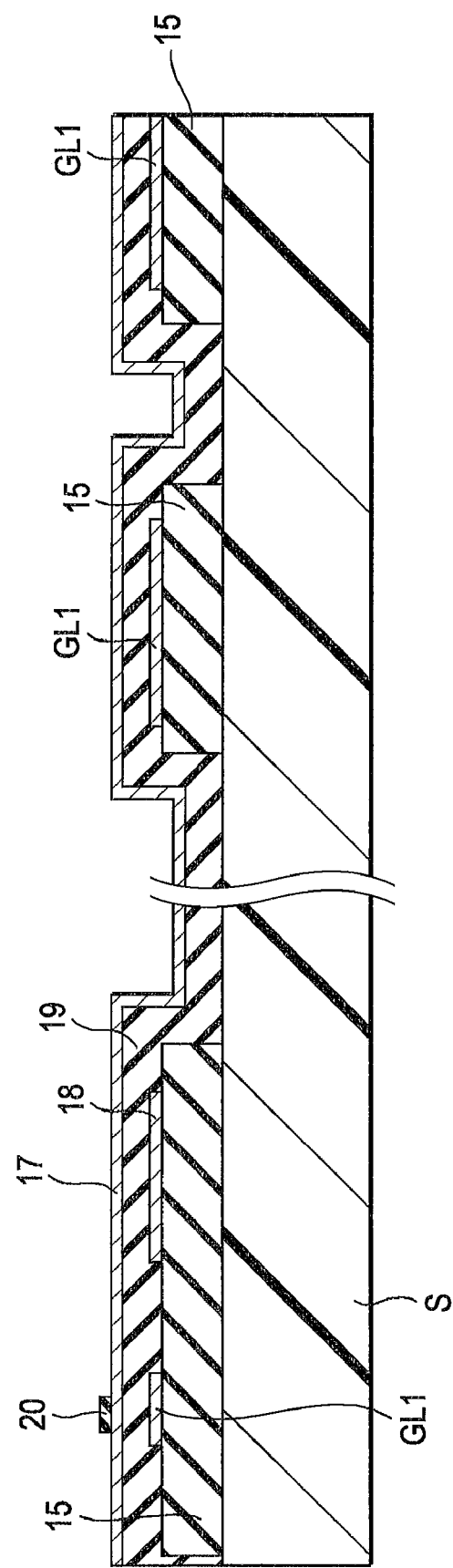
FIG. 18 is a sectional view illustrating the method for producing the array substrate according to the second embodiment.
Figure 19:
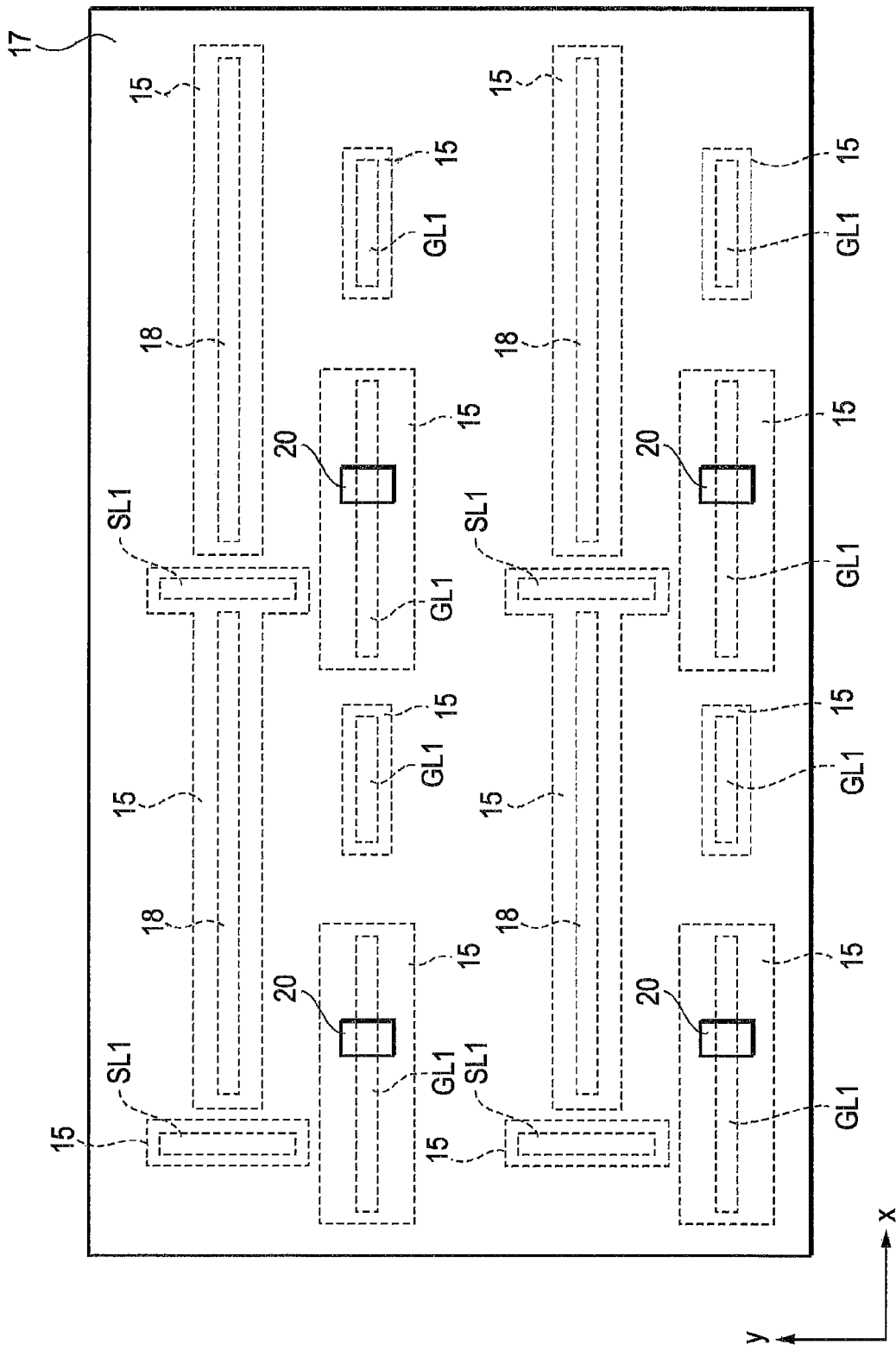
FIG. 19 is a plan view illustrating the method for producing the array substrate according to the second embodiment.

Referring to FIG. 18, the gate insulating film 19 is formed over the entire surface of the substrate S by depositing, for example, a silicon nitride film to a thickness of about 75 nm by CVD. The semiconductor film 17 is then formed over the entire surface of the gate insulating film 19 by depositing, for example, an undoped amorphous silicon film by CVD. The substantially rectangular etching stopper films 20 are then formed on the channel regions (above the first gate lines GL1) of the semiconductor film 17 (see FIG. 19).

Referring to FIG. 20, the impurity-doped semiconductor film 22 is deposited on the semiconductor film 17 and the etching stopper films 20 by CVD. The laminate of the semiconductor film 17 and the impurity-doped semiconductor film 22 is etched into substantially rectangular shapes. The impurity-doped semiconductor films 22 are further etched above the channel regions to expose the etching stopper films 20. Referring to FIG. 21, as a result, the etching stopper films 20 remain in substantially the centers of the substantially rectangular semiconductor films 17. In addition, the impurity-doped semiconductor films 22 remain on both sides of the etching stopper films 20, serving as source and drain electrodes. The semiconductor films 17 and the impurity-doped semiconductor films 22 also remain above the first electrodes 18 as substantially rectangular laminates Ca. These laminates Ca serve as the second electrodes of the hold capacitors.

The step of forming the etching stopper films 20 can be omitted if the patterning (etching) of the semiconductor film 17 and the impurity-doped semiconductor film 22 can be controlled so as to form the above pattern.

Figure 22:
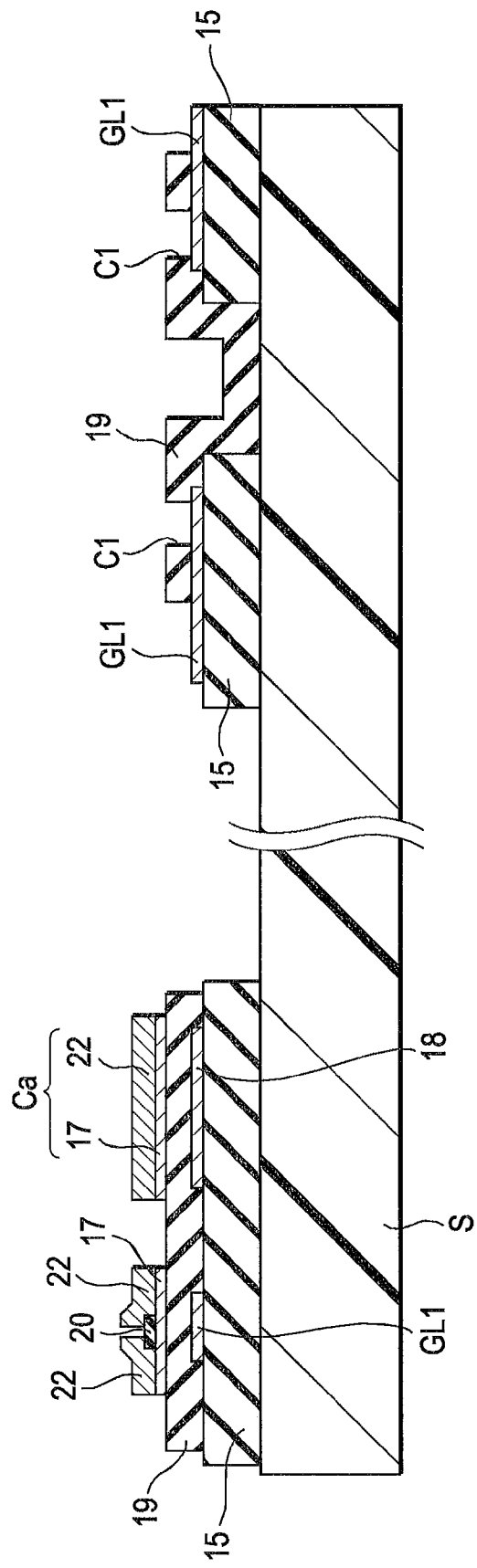
FIG. 22 is a sectional view illustrating the method for producing the array substrate according to the second embodiment.
Figure 24:
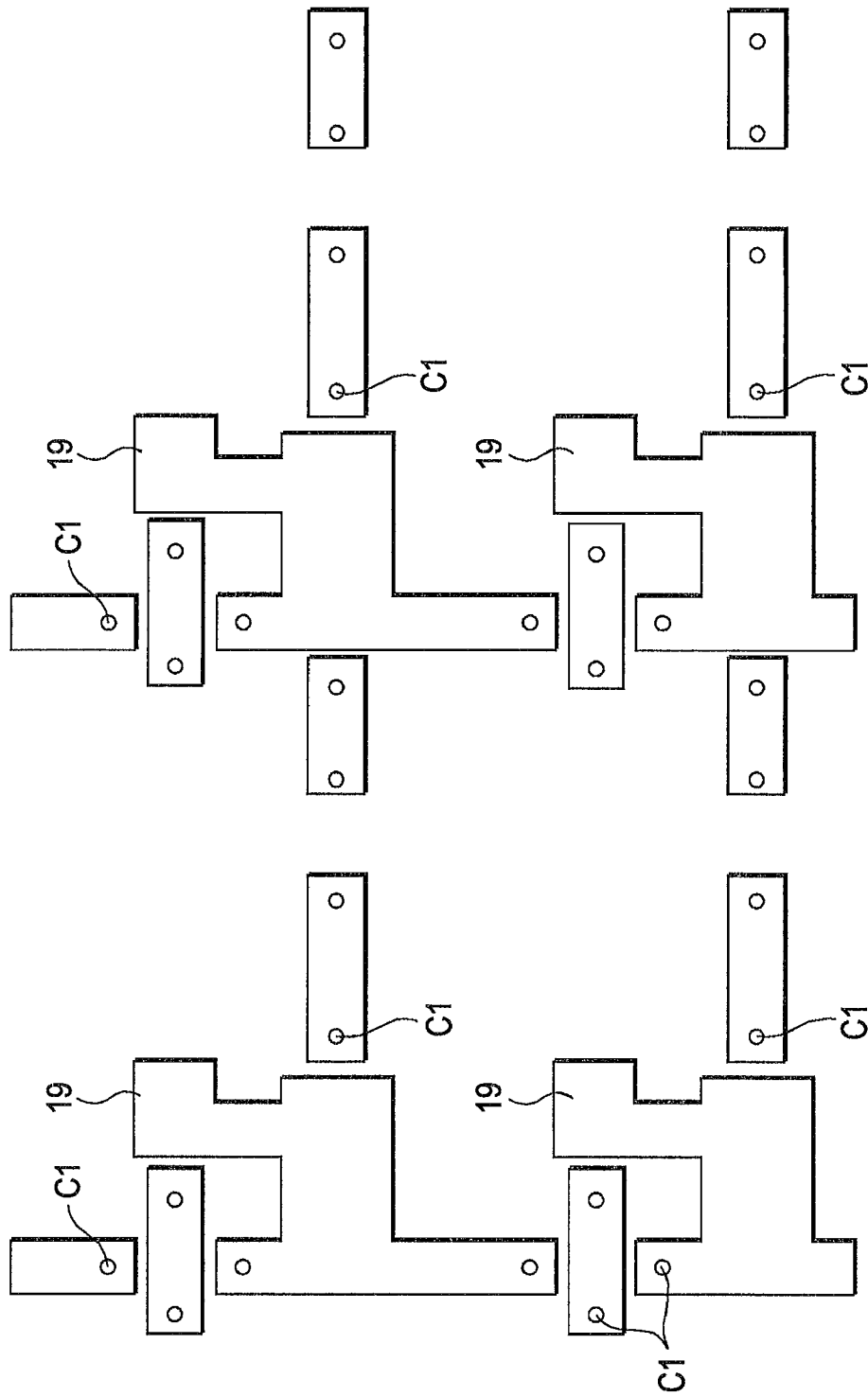
FIG. 24 is a plan view illustrating the method for producing the array substrate according to the second embodiment.

Referring to FIG. 22, the gate insulating film 19 is patterned. FIG. 24 shows only the pattern of the gate insulating film 19 and the contact holes C1 after the patterning. That is, the gate insulating film 19 is patterned such that it remains below the semiconductor films 17 and the laminates Ca, remains in the regions, described later, where the second gate lines GL2 and the second source lines SL2 are to be formed, and remains above the regions between the first electrodes 18 (see FIGS. 23 and 24). At the same time, the contact holes C1 are formed by etching the gate insulating film 19 above both ends of the first gate lines GL1, the first source lines SL1, and the first electrodes 18 (see FIGS. 23 and 24).

Figure 25:
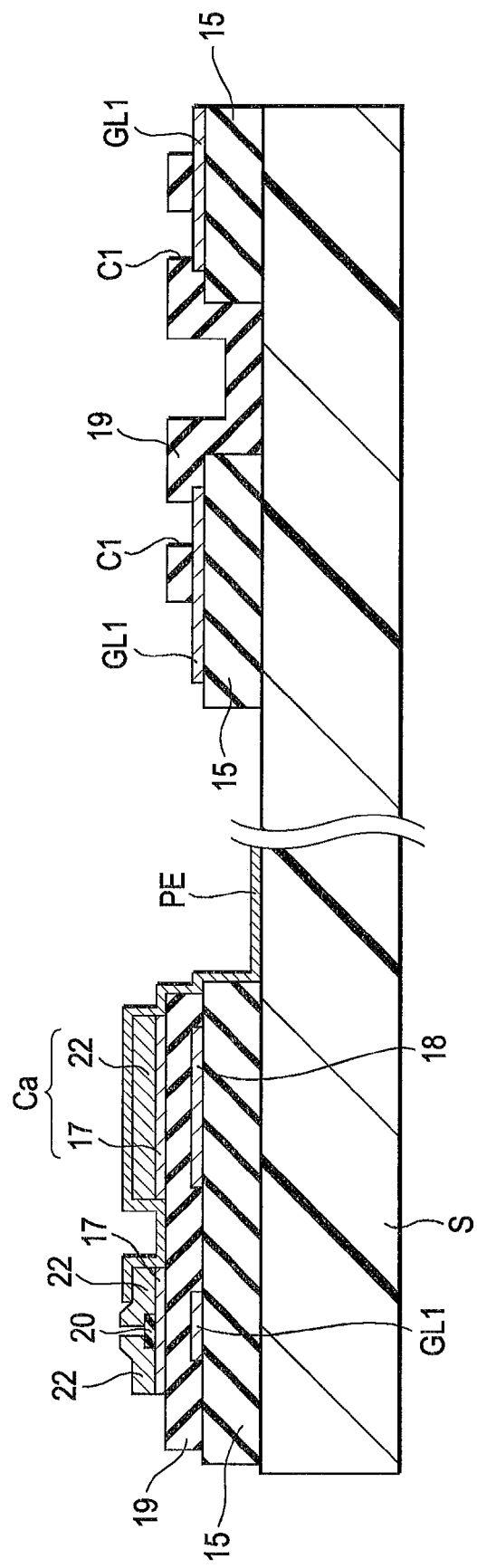
FIG. 25 is a sectional view illustrating the method for producing the array substrate according to the second embodiment.
Figure 26:
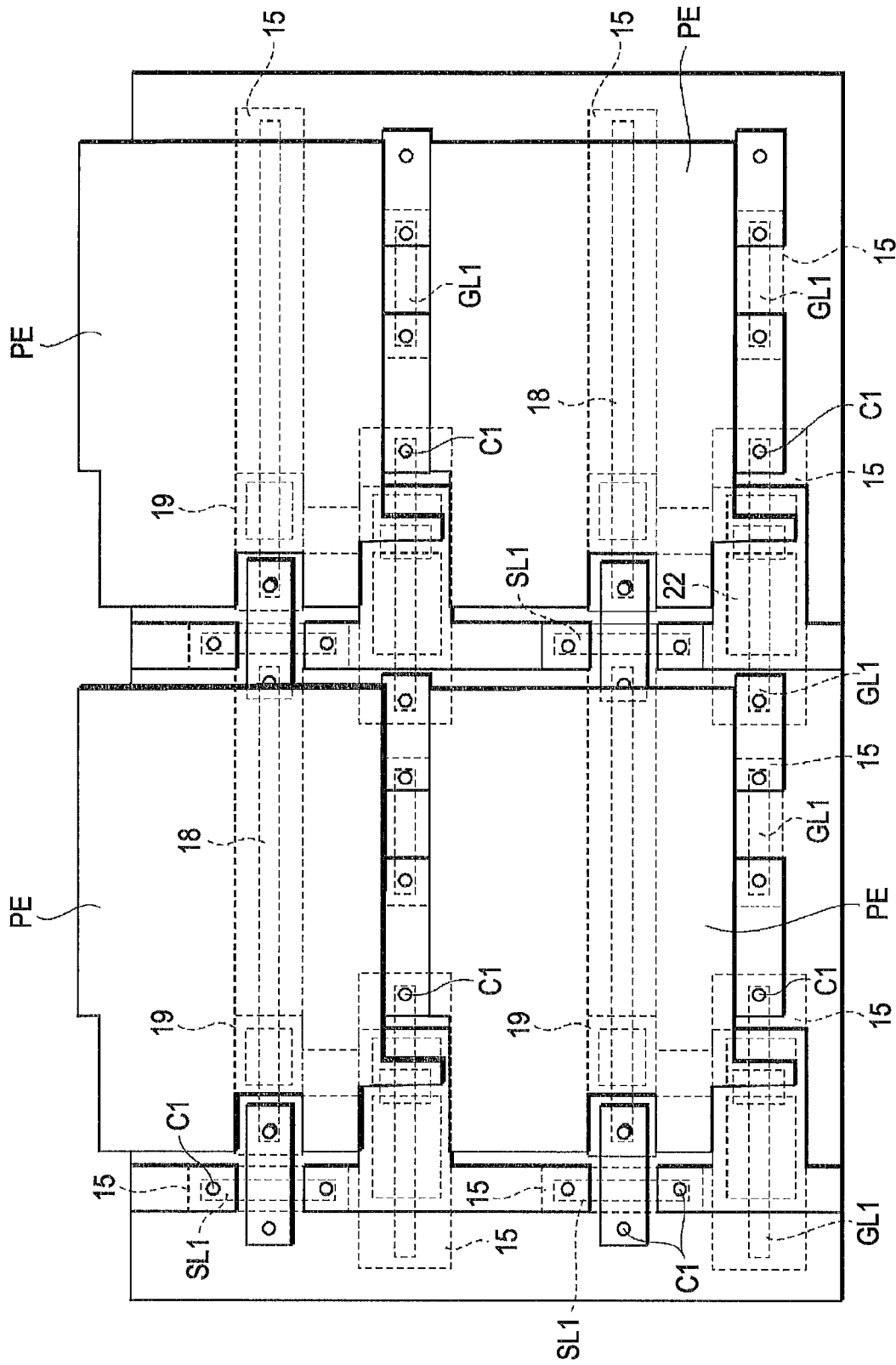
FIG. 26 is a plan view illustrating the method for producing the array substrate according to the second embodiment.

Referring to FIG. 25, the pixel electrodes PE are formed by depositing a conductive film, such as an ITO film, on the substrate S by sputtering and pattering the film (see FIG. 26).

Figure 27:
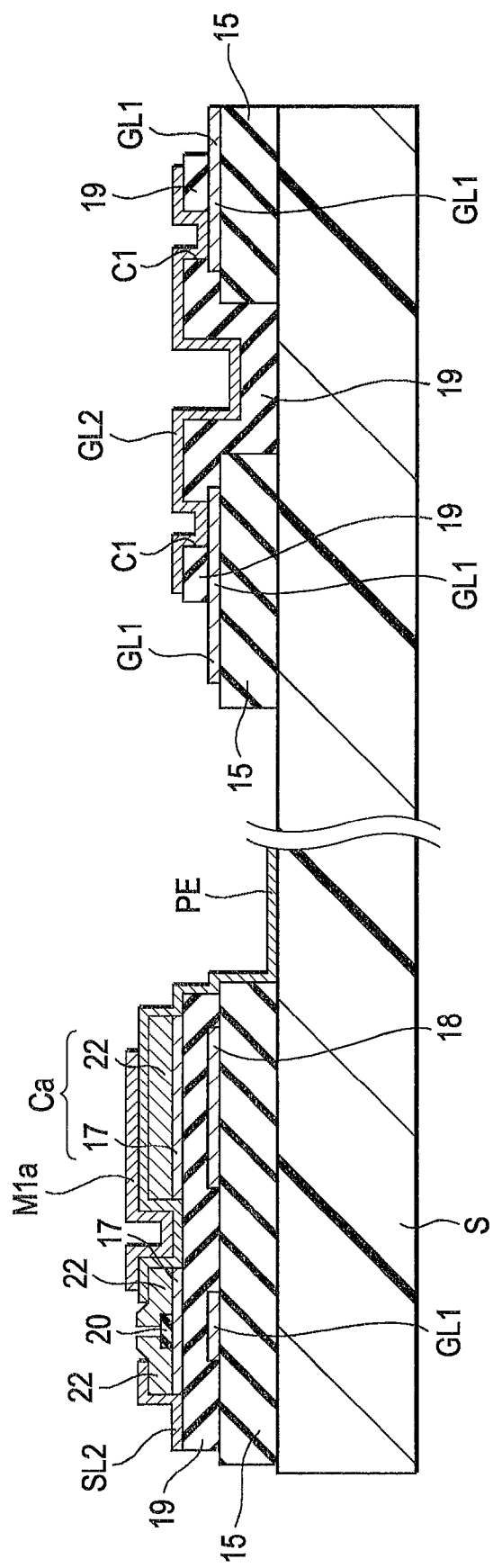
FIG. 27 is a sectional view illustrating the method for producing the array substrate according to the second embodiment.
Figure 28:
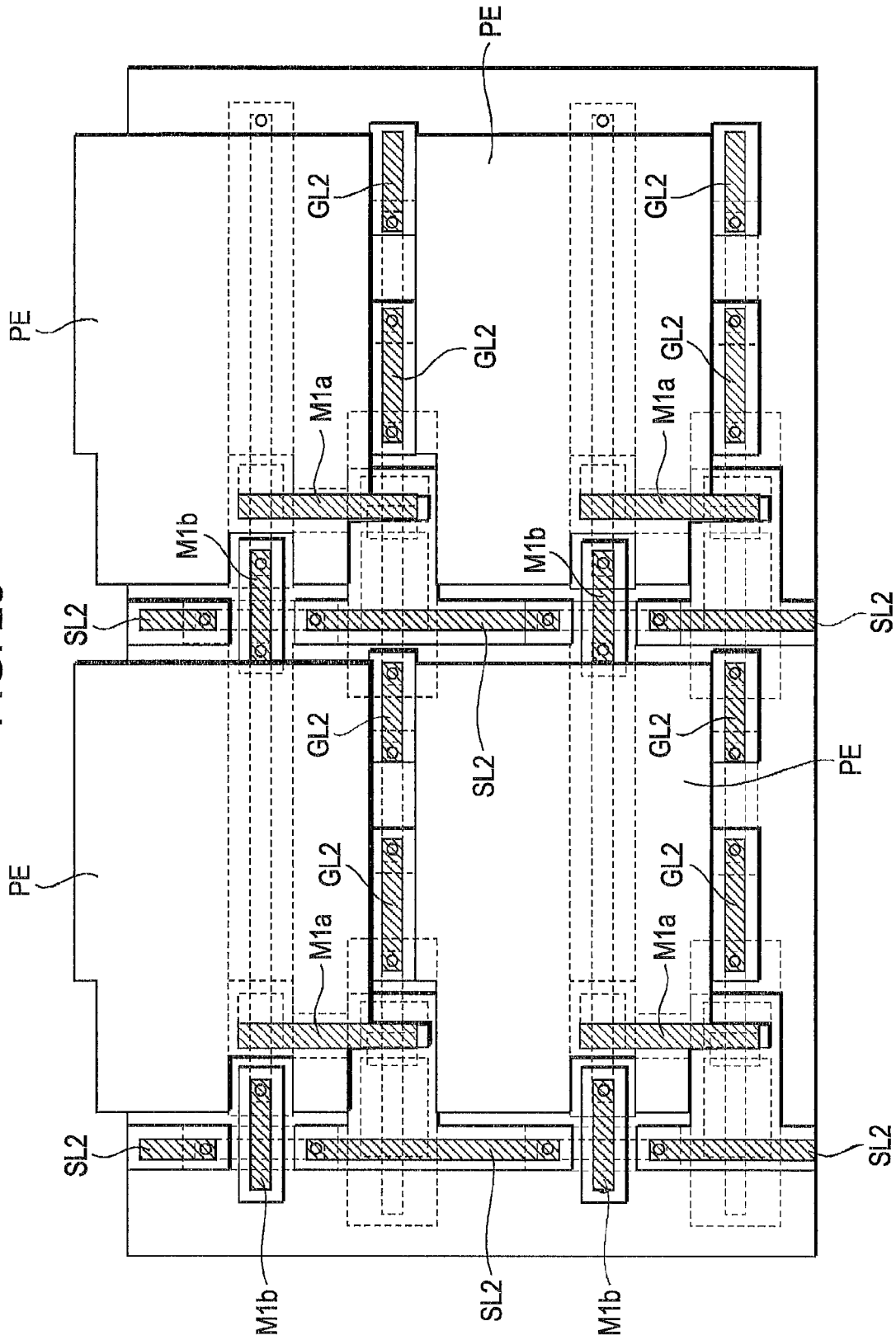
FIG. 28 is a plan view illustrating the method for producing the array substrate according to the second embodiment.

Referring to FIG. 27, wiring lines M1a and M1b, the second gate lines GL2, and the second source lines SL2 are formed by depositing a conductive film, such as an aluminum film, on the substrate S by sputtering and pattering the film (see FIG. 28). The wiring lines M1a extend above the impurity-doped semiconductor films 22 (source and drain electrodes) in the y direction. The wiring lines M1b connect the first electrodes 18 together. The second gate lines GL2 are arranged at intervals in the x direction so as to connect the first gate lines GL1 together, whereas the second source lines SL2 are arranged at intervals in the y direction so as to connect the first source lines SL1 together.

As shown in FIG. 28, the second gate lines GL2 are disposed above the regions between the first gate lines GL1 with the gate insulating film 19 therebetween, whereas the second source lines SL2 are disposed above the regions between the first source lines SL1 with the gate insulating film 19 therebetween. The gate insulating film 19 is divided such that it remains in the regions where the second source lines SL2 and the second gate lines GL2 are to be formed.

The first gate lines GL1 and the second gate lines GL2 are electrically connected together via conductive films in the contact holes C1 formed in the gate insulating films 19 therebetween, thus constituting the overall gate lines GL. The first source lines SL1 and the second source lines SL2 are electrically connected together via conductive films in the contact holes C1 formed in the gate insulating films 19 therebetween, thus constituting the overall source lines SL.

After the above process, the bottom-gate TFTs and the pixel electrodes PE are formed on the substrate S (array substrate).

Process of Producing Electrophoretic Display

Subsequently, an electrophoretic display (not shown) is produced by bonding an electrophoretic sheet including a counter electrode and an electrophoretic capsule layer to a surface of the substrate S in which the pixel electrodes PE are exposed.

In this embodiment, as described in detail above, the base insulating film 15 on the substrate S is divided such that it remains only below the semiconductor films 17 constituting the individual pixels, the first gate lines GL1, the first source lines SL1, and the first electrodes 18. The base insulating film 15 can therefore prevent diffusion of contaminants into the components such as the semiconductor films 17. In addition, the base insulating film 15 can improve the adhesion of the components such as the semiconductor films 17. Furthermore, if the substrate S is formed of a conductive material, the base insulating film 15 can insulate the components such as the semiconductor films 17 from the substrate S.

In addition, because the base insulating film 15 is divided, a stress applied to the base insulating film 15 is reduced; in other words, the stress is absorbed between the islands of the base insulating films 15 (in the regions where no base insulating film 15 is formed). The base insulating film 15 is therefore less likely to crack.

In addition, the gate lines GL and the source lines SL have a multilayer structure including lower wiring lines (GL1 and SL1) and upper wiring lines (GL2 and SL2). Accordingly, for example, the base insulating film 15 does not have to be formed in lines as in the first embodiment; it can be divided and arranged only under the lower wiring lines (GL1 and SL1). This allows the base insulating film 15 to be finely divided, thus contributing to a further stress reduction. The stress can also be reduced because the gate insulating film 19, which serves as an interlayer insulating film between the lower wiring lines (GL1 and SL1) and the upper wiring lines (GL2 and SL2), can be divided.

In addition, because the gate lines GL and the source lines SL have a multilayer structure including lower wiring lines (GL1 and SL1) and upper wiring lines (GL2 and SL2), each wiring line is constituted of short conductive films connected together, so that they are less likely to be broken when a mechanical or thermal stress is applied thereto.

In this embodiment, accordingly, the TFTs and their constituent films are less likely to be damaged or cracked, and therefore an increased yield and improved transistor characteristics (reliability) can be achieved.

Although the components such as the TFTs and the pixel electrodes PE are directly formed on the flexible substrate S in this embodiment, they may instead be formed by a transfer process. That is, the components such as the TFTs and the pixel electrodes PE may be formed on a first substrate as in the above process with a release layer therebetween, be provisionally transferred onto a second substrate with a provisional adhesive layer therebetween, and be transferred onto a third substrate with an adhesive layer therebetween.

Electronic Systems

The electrophoretic displays described in the first and second embodiments can be built into various electronic systems.

Electronic Paper

Figure 29:
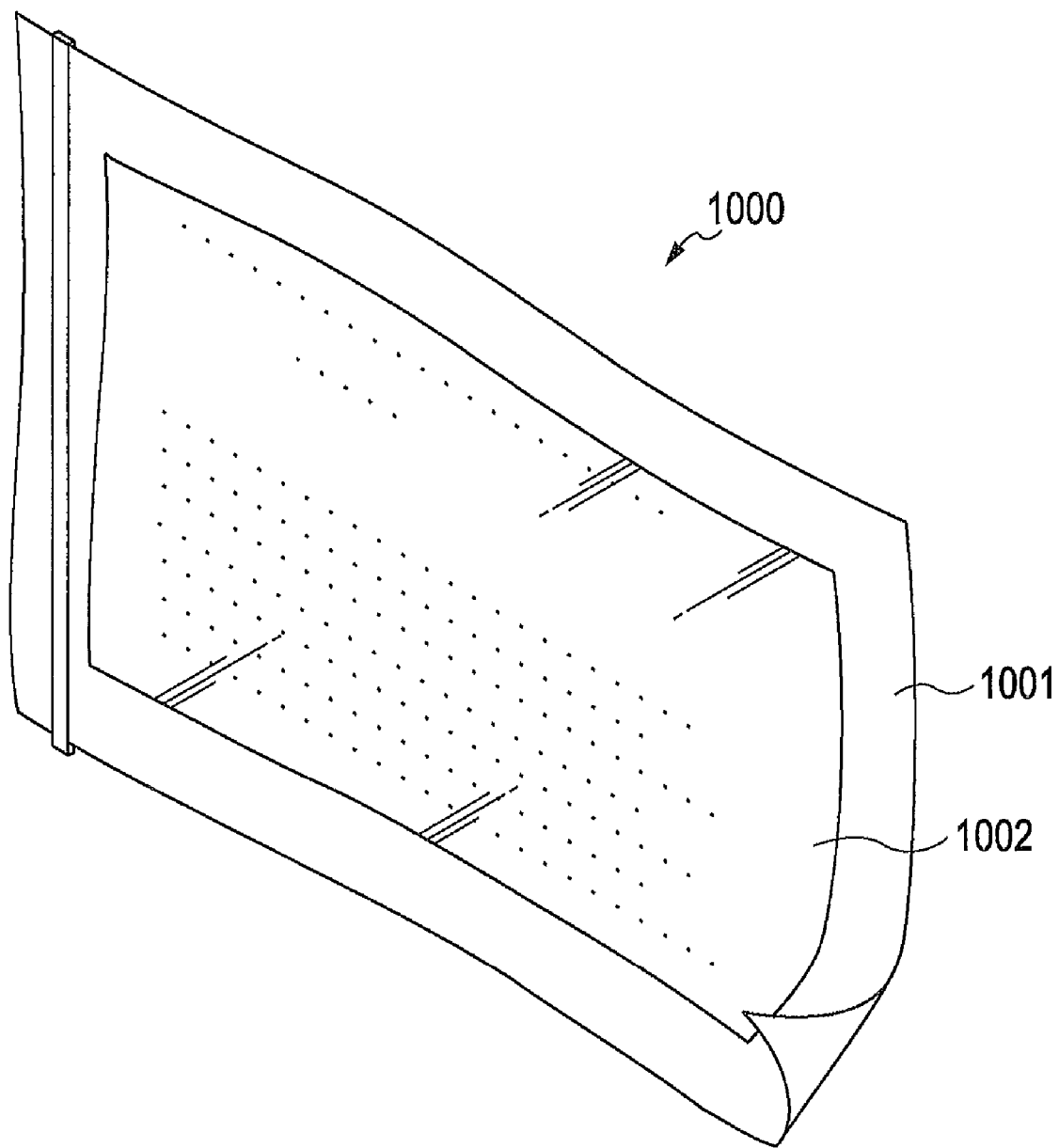
FIG. 29 is a perspective view of electronic paper serving as an example of an electronic system.

For example, the above electrophoretic displays can be applied to electronic paper. FIG. 29 is a perspective view of electronic paper serving as an example of an electronic system.

In FIG. 29, electronic paper 1000 includes a main body 1001 composed of a rewritable sheet with appearance and flexibility similar to those of paper and a display unit 1002. In the electronic paper 1000, the display unit 1002 includes an electrophoretic display as described above.

Although the electrophoretic displays have been described as an example in the above embodiments, the invention can also be applied to various other electrooptical apparatuses (displays) such as liquid crystal apparatuses and organic electroluminescent (EL) apparatuses.

Other Electronic Systems

Figure 30:
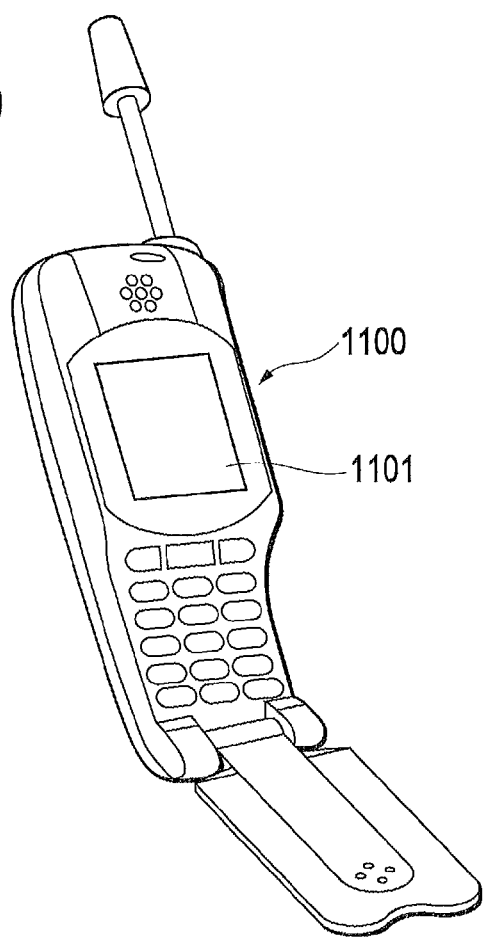
FIG. 30 is a perspective view of a cellular phone serving as an example of an electronic system.
Figure 31:
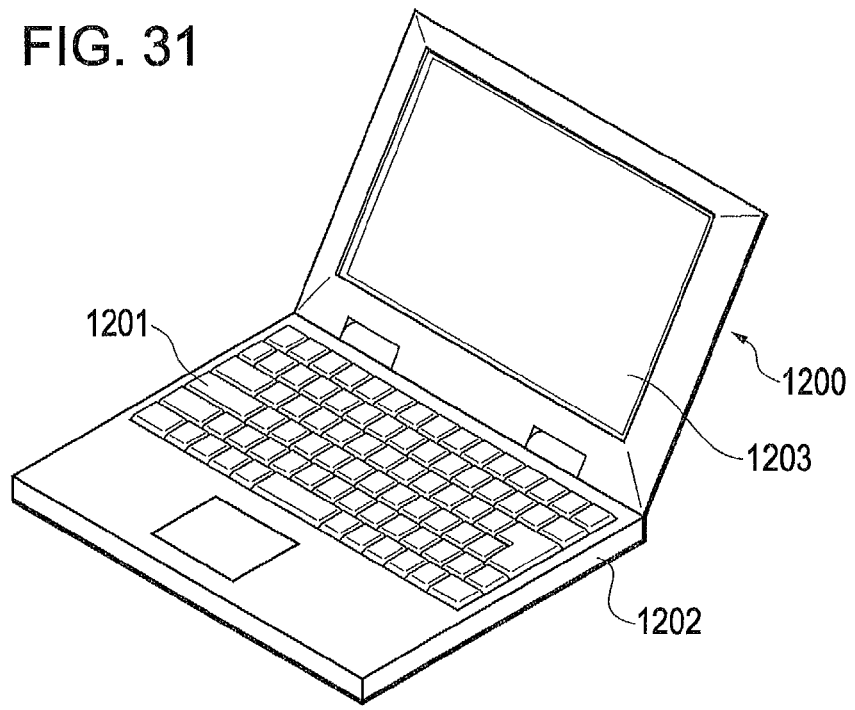
FIG. 31 is a perspective view of a portable information processor serving as an example of an electronic system.

FIGS. 30 and 31 show examples of electronic systems including the above electrooptical apparatuses.

FIG. 30 is a perspective view of a cellular phone serving as an example of an electronic system. In FIG. 30, a cellular phone 1100 includes a display unit 1101 into which the above electrooptical apparatuses can be built.

FIG. 31 is a perspective view of a portable information processor serving as an example of an electronic system. In FIG. 31, a portable information processor 1200 includes an input unit 1201 such as a keyboard; a main body 1202 accommodating a computing unit and a storage unit; and a display unit 1203 into which the above electrooptical apparatuses can be built.

Other examples of applications include televisions, viewfinder- and monitor-equipped video tape recorders, car navigation systems, pagers, electronic organizers, calculators, electronic newspaper, word processors, personal computers, work stations, video phones, POS terminals, and touch-panel-equipped systems. The above electrooptical apparatuses can be built into display units of such various electronic systems.

The examples and applications described in the above embodiments can be appropriately combined, changed, and modified as needed, and the invention is not limited to the embodiments described above.

For example, the materials described in the above embodiments are merely examples and can be appropriately changed. In addition, the patterns of the individual members described in the above embodiments can be appropriately changed without departing from the spirit of the invention.

The entire disclosure of Japanese Patent Application No. 2008-084791, filed Mar. 27, 2008 is expressly incorporated by reference herein.

What is claimed is:

1. A semiconductor device on a flexible substrate, comprising:
   a plurality of insulating layers disposed on the flexible substrate, each of the insulating layers having either a gate line or a source line formed thereon in a manner where the gate line or the source line is entirely overlapped by the insulating layer, the semiconductor device including both gate lines and source lines;
   a plurality of gate insulating films formed over the gate lines and the source lines; and
   a plurality of thin-film transistors and semiconductor films formed on the gate insulating films,
   wherein the insulating layers and the gate insulating films are not disposed in regions where the gate lines and source lines are not disposed.

2. The semiconductor device of claim 1, wherein the insulating layers are arranged in an island-like pattern.

3. The semiconductor device of claim 1, wherein the gate insulating films are arranged in an island-like pattern.

4. The semiconductor device of claim 1, wherein gate lines include first gate lines and second gate lines, the second gate lines electrically interconnecting adjacent first gate lines.

5. The semiconductor device of claim 4, wherein the second gate lines are formed on the gate insulating films.

6. The semiconductor device of claim 4, wherein the gate insulating film is disposed between the first gate lines and the second gate lines in thickness direction.

* * * * *